(12) United States Patent
Budianu et al.

(10) Patent No.: US 8,812,063 B2
(45) Date of Patent: *Aug. 19, 2014

(54) SIGNAL CHARACTERISTIC-BASED LEADING EDGE DETECTION

(75) Inventors: Petru Cristian Budianu, San Diego, CA (US); David Jonathan Julian, San Diego, CA (US); Amal Ekbal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 433 days.

This patent is subject to a terminal disclaimer.

(21) Appl. No.: 12/890,076

(22) Filed: Sep. 24, 2010

(65) Prior Publication Data

US 2011/0294450 A1 Dec. 1, 2011

Related U.S. Application Data

(60) Provisional application No. 61/348,454, filed on May 26, 2010, provisional application No. 61/358,633, filed on Jun. 25, 2010.

(51) Int. Cl.
*H04L 7/02* (2006.01)
*H04B 17/00* (2006.01)
*H03K 5/08* (2006.01)
*H03K 5/1534* (2006.01)
*H04B 1/7163* (2011.01)

(52) U.S. Cl.
CPC .............. *H03K 5/082* (2013.01); *H03K 5/1534* (2013.01); *H04B 1/71637* (2013.01)
USPC ....... 455/575.2; 455/226.1; 455/39; 375/360; 375/353; 375/354; 375/342; 375/345

(58) Field of Classification Search
CPC ............. H04B 17/004; H04B 17/0057; H04B 17/0062; H04B 1/027; H04B 1/26
USPC .............. 455/226.1, 39, 575.2; 375/360, 353, 375/354, 342, 345
See application file for complete search history.

(56) References Cited

U.S. PATENT DOCUMENTS 3,602,825 A 8/1971 Senior
4,115,773 A 9/1978 Metcalf
(Continued)

FOREIGN PATENT DOCUMENTS

CN 101251594 A 8/2008
EP 1667321 A1 6/2006
(Continued)

OTHER PUBLICATIONS

International Search Report and Written Opinion—PCT/US2011/038225, ISA/EPO—Oct. 21, 2011.

(Continued)

*Primary Examiner* — Bobbak Safaipour
(74) *Attorney, Agent, or Firm* — Paul S. Holdaway

(57) ABSTRACT

In a signal-based gain control scheme, one or more gain levels used for processing signals are selected based on characteristics of previously received signals. For example, different gain levels may be used to receive sets of signals whereupon certain characteristics of the received sets of signals are determined. One or more gain levels are then selected based on these characteristics whereby another signal is processed based on the selected gain level(s). In some aspects, the signal-based gain control scheme may be employed to facilitate two-way ranging operations between two devices. For example, leading edge detection may involve determining a characteristic of a received signal, determining a threshold based on the characteristic, and identifying a leading edge associated with the received signal based on the threshold. In some aspects, the signal-based gain control scheme may be employed in an ultra-low power pulse-based communication system (e.g., in ultra-wideband communication devices).

37 Claims, 20 Drawing Sheets

(56) References Cited

U.S. PATENT DOCUMENTS

| | | |
|---|---|---|
| 4,455,556 A | 6/1984 | Koshio et al. |
| 5,555,277 A | 9/1996 | Lawrence et al. |
| 6,414,635 B1 | 7/2002 | Stewart et al. |
| 6,697,629 B1 | 2/2004 | Grilli et al. |
| 7,151,759 B1 | 12/2006 | Ryan et al. |
| 7,653,004 B2 | 1/2010 | Strutt |
| 7,710,321 B2 | 5/2010 | Heidari-Bateni et al. |
| 7,719,994 B2 | 5/2010 | Zumsteg |
| 7,739,705 B2 | 6/2010 | Lee et al. |
| 7,817,762 B2 * | 10/2010 | Johnstone et al. ............ 375/360 |
| 7,822,098 B2 | 10/2010 | Sahinoglu |
| 8,036,064 B2 | 10/2011 | McFarland |
| 8,184,038 B2 * | 5/2012 | Ekbal et al. .................. 342/109 |
| 8,289,159 B2 | 10/2012 | Julian et al. |
| 8,552,903 B2 | 10/2013 | Julian et al. |
| 2003/0053493 A1 | 3/2003 | Graham Mobley et al. |
| 2003/0147655 A1 | 8/2003 | Shattil |
| 2004/0005022 A1 | 1/2004 | Zhu et al. |
| 2004/0058653 A1 | 3/2004 | Dent |
| 2005/0058081 A1 | 3/2005 | Elliott |
| 2006/0120441 A1 * | 6/2006 | Nakagawa et al. ........... 375/152 |
| 2006/0176082 A1 * | 8/2006 | Johnstone et al. ................ 327/1 |
| 2007/0165756 A1 | 7/2007 | Lachartre |
| 2007/0200759 A1 | 8/2007 | Heidari-Bateni et al. |
| 2007/0243843 A1 | 10/2007 | Shalash |
| 2007/0258548 A1 | 11/2007 | Sutton |
| 2007/0276616 A1 | 11/2007 | Wilcox |
| 2008/0043824 A1 | 2/2008 | Jacobs et al. |
| 2008/0056419 A1 * | 3/2008 | Lee et al. ...................... 375/355 |
| 2008/0225758 A1 | 9/2008 | Proctor et al. |
| 2008/0252517 A1 | 10/2008 | Fuchs et al. |
| 2009/0033399 A1 | 2/2009 | Schwoerer et al. |
| 2009/0149132 A1 | 6/2009 | LeFever et al. |
| 2009/0149202 A1 | 6/2009 | Hill et al. |
| 2009/0170458 A1 * | 7/2009 | Molisch et al. ............ 455/226.1 |
| 2009/0310586 A1 * | 12/2009 | Shatti ............................ 370/338 |
| 2010/0045508 A1 | 2/2010 | Ekbal et al. |
| 2010/0046388 A1 | 2/2010 | Kim et al. |
| 2010/0054322 A1 * | 3/2010 | Hui et al. ..................... 375/232 |
| 2010/0112967 A1 | 5/2010 | Sorensen |
| 2011/0019002 A1 * | 1/2011 | Jagmohan et al. ............ 348/159 |
| 2011/0068966 A1 * | 3/2011 | Daniels et al. ................ 341/161 |
| 2011/0216816 A1 | 9/2011 | Frenzel |
| 2011/0222373 A1 | 9/2011 | Lee |
| 2011/0292819 A1 | 12/2011 | Ekbal et al. |
| 2011/0292820 A1 | 12/2011 | Ekbal et al. |
| 2011/0294449 A1 * | 12/2011 | Budianu et al. ............ 455/245.1 |
| 2011/0316747 A1 * | 12/2011 | Budianu et al. ............... 342/387 |
| 2012/0001783 A1 | 1/2012 | Eklund et al. |
| 2012/0157205 A9 | 1/2012 | Mooney et al. |
| 2014/0009340 A1 | 1/2014 | Meador et al. |

FOREIGN PATENT DOCUMENTS

| | | |
|---|---|---|
| GB | 2267192 A | 11/1993 |
| GB | 2419046 A | 4/2006 |
| JP | H02223882 A | 9/1990 |
| JP | 2005520139 A | 7/2005 |
| JP | 2008522181 A | 6/2008 |
| JP | 2008527769 A | 7/2008 |
| JP | 2008538065 A | 10/2008 |
| JP | 2009150872 A | 7/2009 |
| JP | 2009535625 A | 10/2009 |
| JP | 2010050964 A | 3/2010 |
| WO | 9716700 A1 | 5/1997 |
| WO | WO 0193446 A2 | 12/2001 |
| WO | WO 2005109634 A1 | 11/2005 |
| WO | WO-2006098790 | 9/2006 |
| WO | WO-2006112850 A1 | 10/2006 |
| WO | WO 2007011357 A1 | 1/2007 |
| WO | WO-2007121476 A1 | 10/2007 |
| WO | WO-2007121488 A1 | 10/2007 |
| WO | 2007127886 A2 | 11/2007 |
| WO | WO-2007127721 A2 | 11/2007 |
| WO | WO2008022460 A1 | 2/2008 |
| WO | 2009110669 A1 | 9/2009 |
| WO | WO2009128590 A1 | 10/2009 |
| WO | WO-2009144582 | 12/2009 |
| WO | WO-2010022273 A1 | 2/2010 |

OTHER PUBLICATIONS

Han Yalan et al., "Research on Two-way Ranging-Based High Precision Clock Synchronization Method for Pseudo Satellite Network", Telemetering and telecontrol, 2010-05-31, vol. 31, No. 5.

* cited by examiner

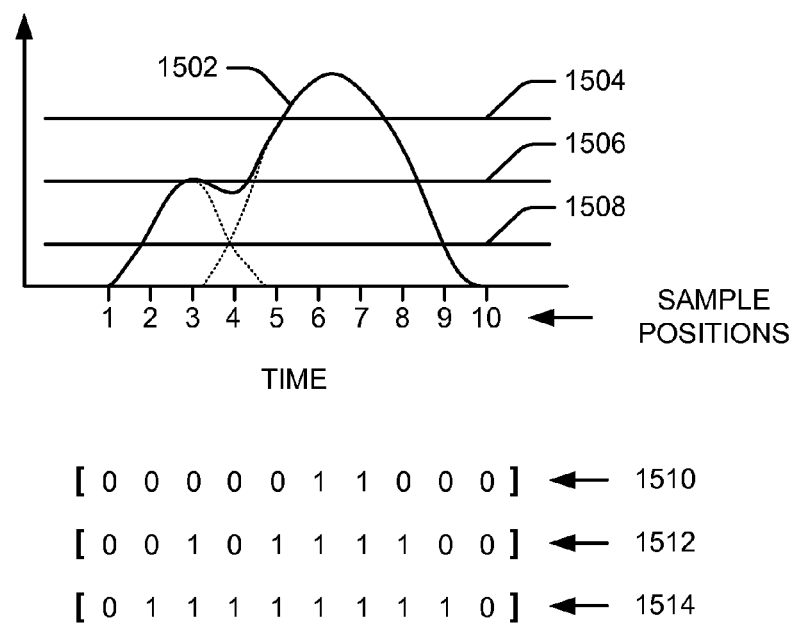
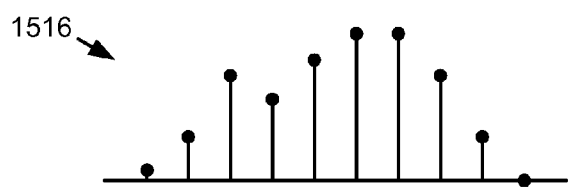
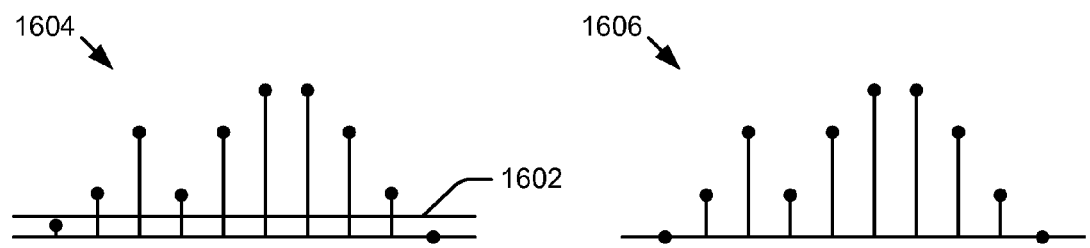
FIG. 15
FIG. 16

SIGNAL CHARACTERISTIC-BASED LEADING EDGE DETECTION

CLAIM OF PRIORITY

This application claims the benefit of and priority to commonly owned U.S. Provisional Patent Application No. 61/348,454, filed May 26, 2010, and U.S. Provisional Patent Application No. 61/358,633, filed Jun. 25, 2010, the disclosure of each of which is hereby incorporated by reference herein.

CROSS-REFERENCE TO RELATED APPLICATION

This application is related to concurrently filed and commonly owned U.S. patent application Ser. No. 12/890,004, entitled "SIGNAL-BASED GAIN CONTROL," the disclosure of which is hereby incorporated by reference herein.

BACKGROUND

1. Field of the Invention

This application relates generally to signal processing and more specifically, but not exclusively, to signal-based gain control.

2. Relevant Background

Gain control may be used in a communication system to select an appropriate gain to be applied to a signal to facilitate subsequent processing of that signal. For example, gain control may be employed in a receiver to adjust the gain of an amplifier that is used to receive a signal. Here, the gain may be increased when receiving weak signals and decreased when receiving strong signals.

Some systems may employ automatic gain control (AGC) to adjust the gain to be applied to a signal. For example, a receiver may monitor signals in a communication channel and automatically adjust the gain used to receive signals over that communication channel based on the monitored signals. In practice, some types of AGC may be relatively complex. For example, AGC may rely on the use of a coherent receiver to acquire received signals. However, in some implementations it may be desirable to have a relatively low complexity system, yet also provide relatively robust gain control.

SUMMARY

A summary of several sample aspects of the disclosure follows. This summary is provided for the convenience of the reader and does not wholly define the breadth of the disclosure. For convenience, the term "some aspects" may be used herein to refer to a single aspect or multiple aspects of the disclosure.

The disclosure relates in some aspects to a signal-based gain control scheme that selects one or more gain levels for processing signals based on gain level-related characteristics of previously received signals. For example, initially, different gain levels may be used to receive several sets of signals. Next, certain characteristics of the received sets of signals are determined. At least one gain level is then selected based on these characteristics, whereby a subsequently received signal is processed based on the selected gain level(s).

The disclosure relates in some aspects to using signal-based gain control for two-way ranging between two devices. Here, accurate distance estimation may be dependent on accurate detection of a leading edge of a received signal at each device. A threshold used to detect such a leading edge may be selected through the use of signal-based gain control as taught herein.

The disclosure relates in some aspects to a leading edge detection scheme that identifies a leading edge of a received signal based on a threshold that is, in turn, based on a characteristic of a received signal. In some aspects, this scheme may involve signal-based gain control where one or more gain levels used for processing signals to identify a leading edge are selected based on characteristics of previously received signals. For example, initially, different gain levels are used to receive several sets of signals. Next, certain characteristics of the received sets of signals are determined (e.g., a minimum gain level that enables successful detection of a signal at the receiver may be determined here). At least one gain level for receiving another signal is then selected based on these characteristics, whereby a leading edge of the other signal is determined based on the selected gain level(s). For example, the selected gain levels(s) may be used to receive the other signal to facilitate more accurate detection of the leading edge of that signal. As another example, a threshold for detecting the leading edge (e.g., estimating a time-of-arrival of the leading edge) may be specified based on the selected gain levels(s).

The disclosure relates in some aspects to using signal-based gain control and/or leading edge detection in a pulse-based communication system (e.g., a system that employs ultra-wideband (UWB) pulses). In some cases, such pulse-based communication may be used to achieve ultra-low power consumption (e.g., through the use of non-coherent radio components). Accordingly, the signal-based gain control and/or leading edge detection teachings herein may be employed to provide an ultra-low power UWB radio.

BRIEF DESCRIPTION OF THE DRAWINGS

These and other sample aspects of the disclosure will be described in the detailed description and the appended claims that follow, and in the accompanying drawings, wherein:

FIG. 15 is a simplified diagram illustrating an example of signal reconstruction;

FIG. 16 is a simplified diagram illustrating an example of a thresholding operation;

Figure 1:
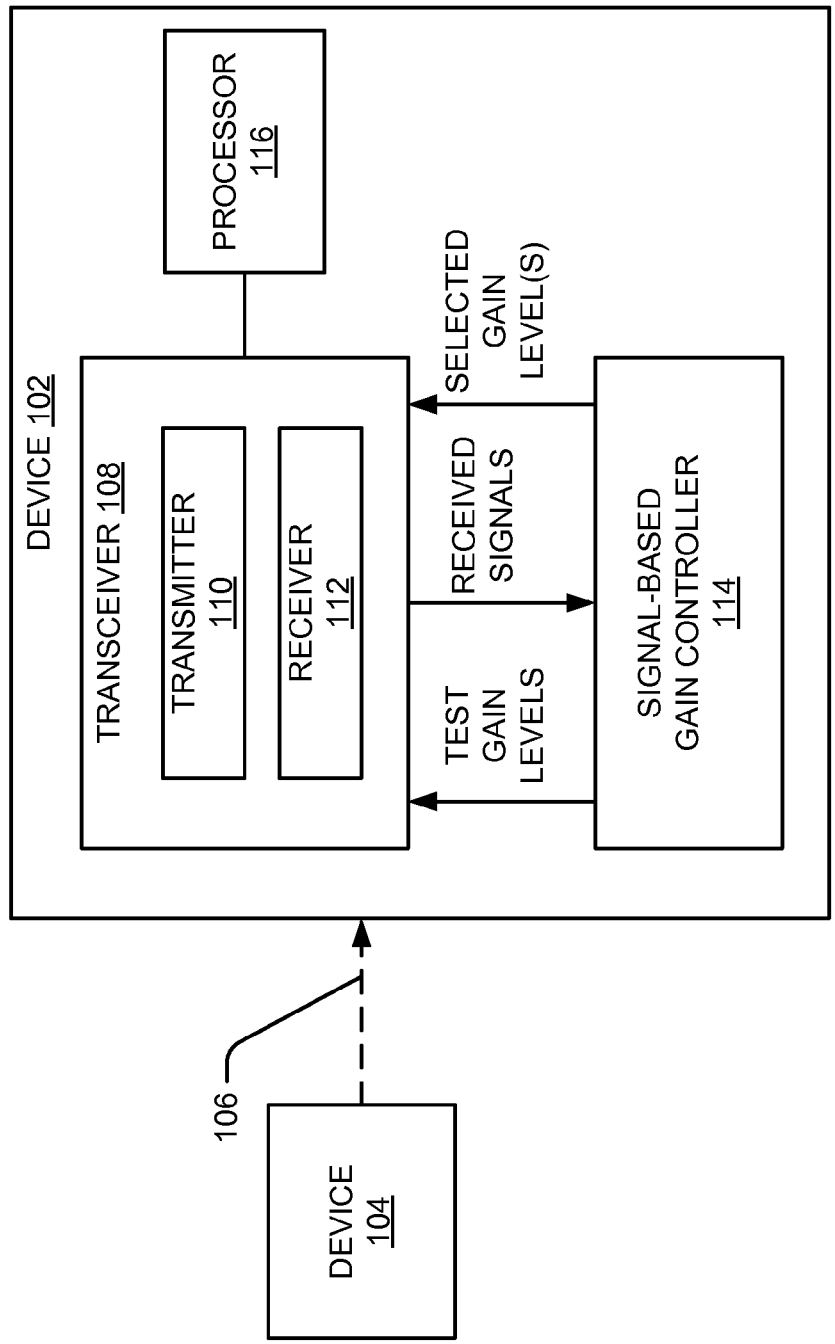
FIG. 1 is a simplified block diagram illustrating an example of a communication system incorporating signal-based gain control.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of the disclosure are described below. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim. As an example of the above, in some aspects, a method of signal processing comprises: receiving sets of signals using different gain levels of a set of gain levels; determining characteristics of the received sets of signals; selecting a gain level from the set of gain levels based on the determined characteristics; and processing another signal based on the selected gain level. In addition, in some aspects, the characteristics comprise a plurality of gain level metrics that indicate how the use of the different gain levels affects the reception of the sets of signals.

FIG. 1 illustrates a sample communication 100 including devices 102 and 104. At some point in time, the device 104 sends a sequence of signals to the device 102 (e.g., as represented by the dashed line 106). A signal-based gain controller 114 of the device 102 provides a set of test gain levels that a transceiver 108 of the device 102 uses to receive the sequence of signals. Then, based on certain characteristics of the signals that were received using the different test gains levels, the signal-based gain controller 114 selects at least one gain level that is used for processing another sequence of signals sent by the device 104. For example, the transceiver 108 may receive the other sequence of signals using the selected gain level(s). Also, a processor 116 may process the other sequence of signals based on the selected gain level(s) (e.g., to provide information for a ranging operation).

For a ranging operation, the device 104 sends an initial signal to the device 102 (e.g., as represented by the dashed line 106). A transceiver 108 of the device 102 receives this signal and provides received signal information to the signal-based gain controller 114. The signal-based gain controller 114 then selects at least one gain level that is used for acquisition of subsequent ranging signals sent by the device 104 (e.g., as represented by the dashed line 106).

In some aspects, leading edge detection may involve processing several received pulses to identify a leading edge associated with those pulses. For example, a preliminary timestamp may be generated upon reception of a first pulse of a set of pulses. All of the pulses of the set may then be processed to assist in determining (e.g., estimating) leading edge location and timing for these pulses (e.g., the average location and timing of a leading edge). The preliminary timestamp for the first pulse may then be adjusted based on the leading edge information for the set to provide a final time-of-arrival estimate.

As an example of the above, in a low power receiver (e.g., which may be advantageously employed in a UWB device), jitter and/or other conditions may adversely affect the accuracy with which the leading edge of a given pulse is identified. The effects of these conditions may be mitigated (e.g., averaged out), however, by generating a reconstruction of a received pulse based on several pulses. In this case, leading edge characteristics of the reconstructed signal may be correlated to any pulse of the set, thereby providing a more accurate leading edge time-of-arrival estimate for that pulse.

In some aspects, leading edge detection may involve identifying a leading edge of a signal lobe associated with a first local maximum of a reconstruction of the received signal. In this way, a leading edge may be accurately identified even if a signal is received via a channel that has multiple signal paths, which results in a received signal having multiple lobes.

In some implementations, the device 102 identifies a leading edge through the use of a received signal thresholding scheme. Here, a threshold is determined based on a characteristic (e.g., amplitude) of a received signal. This threshold may then be used to identify a leading edge of another received signal. Advantageously, such a scheme may facilitate accurate leading edge detection even under different signaling conditions (e.g., different signal-to-noise ratio (SNR) conditions) in the communication channel between the devices 102 and 104.

For purposes of illustration, FIG. 1 depicts the transmission of signals from the device 104 to the device 102 and components of the device 102 that facilitate receiving and processing those signals. It should be appreciated, however, that the device 102 also may send signals to the device 104 and that the device 104 may include components that are similar to those depicted for the device 102. For example, in conjunction with two-way ranging operations, the processor 116 may provide leading edge information such as estimated time-of-arrival information that is sent via the transceiver 108 to the device 104. Also, the processor 116 may receive information from the device 104 (e.g., in conjunction with two-way ranging operations) via the transceiver 108.

The devices 102 and 104 may be implemented in various ways. In some implementations, the devices 102 and 104 comprise wireless devices (e.g., nodes) that transmit radiofrequency (RF) signals over-the-air. In other implementations the devices may transmit other types of signal.

Figure 2:
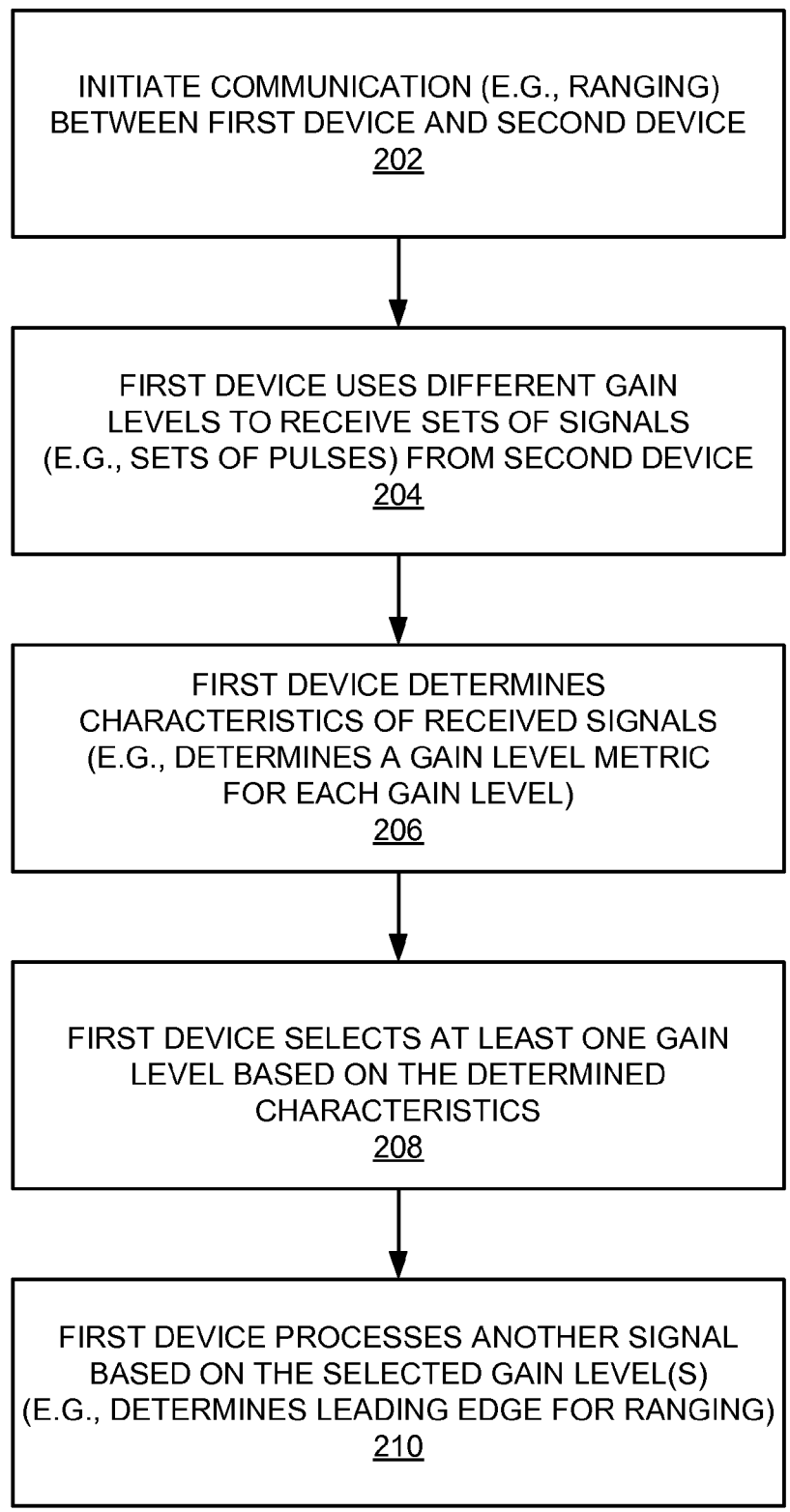
FIG. 2 is a flowchart of several sample aspects of operations that may be performed to process a signal based on signal-based gain control.
Figure 3:
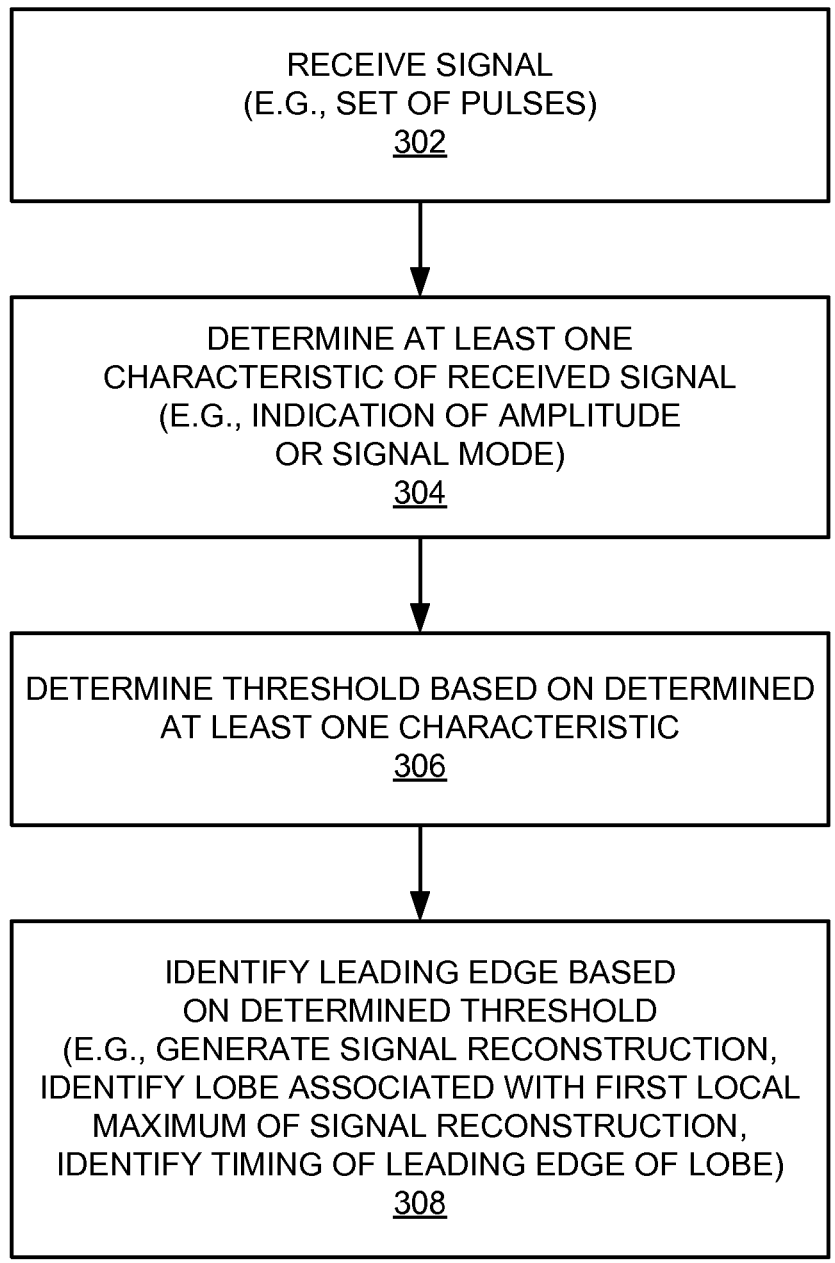
FIG. 3 is a flowchart of several sample aspects of operations that may be performed to identify a leading edge based on received signal-based thresholding.

Several examples of signal-based gain control operations and leading edge detection operations that may be performed by the system 100 will be described in more detail in conjunction with the flowcharts of FIGS. 2 and 3, respectively. FIG. 2 describes an example of operations that may be employed in an implementation that uses signal-based gain control in accordance with the teachings herein. FIG. 3 describes an example of operations that may be employed in an implementation that uses received signal thresholding operations in accordance with the teachings herein. For convenience, the operations of FIGS. 2 and 3 (or any other operations discussed or taught herein) may be described as being performed by specific components (e.g., the components of FIG. 1, 4, 7, 8, or 9). It should be appreciated, however, that these operations may be performed by other types of components and may be performed using a different number of components. It also should be appreciated that one or more of the operations described herein may not be employed in a given implementation.

As represented by block 202 of FIG. 2, at some point in time, communication is initiated between the first and second device. For example, as discussed in more detail below, in some implementations the devices may initiate a two-way ranging operation to determine the distance between the two devices.

Blocks 204-208 describe operations where the first device receives signals from the second device and processes those signals to determine one or more gain levels that are used for processing other signals received from the second device. In a pulse-based communication system, these signals may comprise sequences of pulses.

As represented by block 204, the first device uses different gain levels to receive different sets of signals from the second device. For example, the receiver 112 may include a step-wise amplifier (e.g., a low noise amplifier) for amplifying received signals. Here, any one of a defined set of gain levels may be used to receive a signal at a given point in time. Thus, in this example, the operations of block 204 may involve receiving different signals using different gain levels of the set of gain levels. For example, a first sequence of pulses may be received using one gain level, a second sequence of pulses may be received using another gain level, and so on.

As represented by block 206, the first device (e.g., the gain controller 114) determines characteristics of the received signals. In particular, the first device may determine one or more characteristics associated with the reception of signals at each gain level. For example, the gain controller 114 may determine a first characteristic associated with the reception of signals using a first gain level, a second characteristic associated with the reception of signals using a second gain level, and so on. Thus, in some aspects, the characteristics may comprise a set of metrics, whereby a given one of the metrics corresponds to a given one of the gain levels. In the discussion that follows, these metrics are thus referred to as gain level metrics.

In some aspects, by determining how the characteristics of comparable signals received with different gain levels differ, the first device may determine how to most effectively receive signals from the second device. For example, as discussed in more detail below, the first device may determine the magnitudes of received signals (e.g., determine a true or pseudo signal-to-noise ratio (SNR)) based on the gain level metrics. Based on this information, the first device may then select one or more parameters for processing other signals received from the second device.

In particular, as represented by block 208, the first device (e.g., the gain controller 114) may select at least one gain level based on the characteristics determined at block 206. For example, if the characteristics indicate that received signals have a relatively low signal level (e.g., low SNR), the gain controller 114 may select one set of gains for receiving a subsequent signal. Conversely, if the characteristics indicate that received signals have a relatively high signal level (e.g., high SNR), the gain controller 114 may select a different set of gains for receiving a subsequent signal.

As represented by block 210, the first device processes another signal based on the gain level(s) selected at block 208. For example, the receiver 112 may quantize the other signal using at least one threshold that is based on the selected gain level(s). As another example, if the first and second devices are performing a ranging operation, the processor 116 may determine a leading edge of a subsequently received signal based on the selected gain level(s).

Referring now to FIG. 3, in some implementations a leading edge is detected based on a threshold that is, in turn, determined based on a characteristic of a received signal. For example, the threshold may be set based on the amplitude of the received signal (e.g., which is indicative of the SNR of the channel).

In some aspects, such an implementation may be employed in conjunction with a signal-based AGC scheme. For example, to identify one or more gain levels to be used for receiving ranging signals, a set of test gain levels are used to receive a first set of signals. Then, based on defined characteristics (e.g., an SNR mode) of the first signals that were received using the different test gains levels, at least one gain level is selected for receiving ranging signals. These ranging signals are then processed to identify a leading edge associated with the ranging signals (e.g., based on the selected gain level(s)).

The operations of FIG. 3 are described from the perspective of an apparatus that receives a signal and identifies a leading edge associated with that signal. Accordingly, as represented by block 302, at some point in time a device receives a signal from a second device. For example, the device may use different gain levels to receive different sets of pulses from the second device. Here, a first sequence of pulses may be received using one gain level, a second sequence of pulses may be received using another gain level, and so on.

As represented by block 304, the device determines at least one characteristic of the received signal. In particular, the device may determine one or more characteristics associated with the reception of signals at each gain level. For example, the device may determine a first characteristic associated with the reception of signals using a first gain level, a second characteristic associated with the reception of signals using a second gain level, and so on. Thus, in some aspects, the characteristics may comprise a set of metrics, whereby a given one of the metrics corresponds to a given one of the gain levels. In the discussion that follows, these metrics are thus referred to as gain level metrics.

In some aspects, by determining how the characteristics of comparable signals received with different gain levels differ, the device may determine how to most effectively receive signals from the other device. For example, as discussed in more detail below, the device may determine the magnitudes of received signals (e.g., determine a true or pseudo signal-to-noise ratio (SNR)) based on the gain level metrics. Based on this information, the device may then select one or more parameters for processing other signals received from the other device. In particular, the device may select at least one gain level based on the determined characteristics. For example, if the characteristics indicate that received signals have a relatively low signal level (e.g., low SNR), one set of gains for receiving a subsequent signal may be selected. Conversely, if the characteristics indicate that received signals have a relatively high signal level (e.g., high SNR), a different set of gains for receiving a subsequent signal may be selected.

As represented by block 306, the device determines at least one threshold based on the characteristic(s) determined at block 304. For example, a threshold may be selected based on the selected gain level(s).

As represented by block 308, the device may then identify a leading edge of another signal received from the second device based on the determined threshold(s). For example, the device may use such a threshold to quantize the subsequently received signal, to identify a point on a leading edge associated with the subsequently received signal, or to perform some other operation.

As described in more detail below in conjunction with FIGS. 8-18, in a received signal-based thresholding scheme, a reconstruction of the received signal may be generated based on the signals acquired at the selected gain level(s). A first local maximum of the signal reconstruction is then identified, whereupon a lobe associated with that first local maximum is identified as well. Finally, a leading edge of the lobe is identified, such that a time-of-arrival of the leading edge may be determined.

Figure 4:
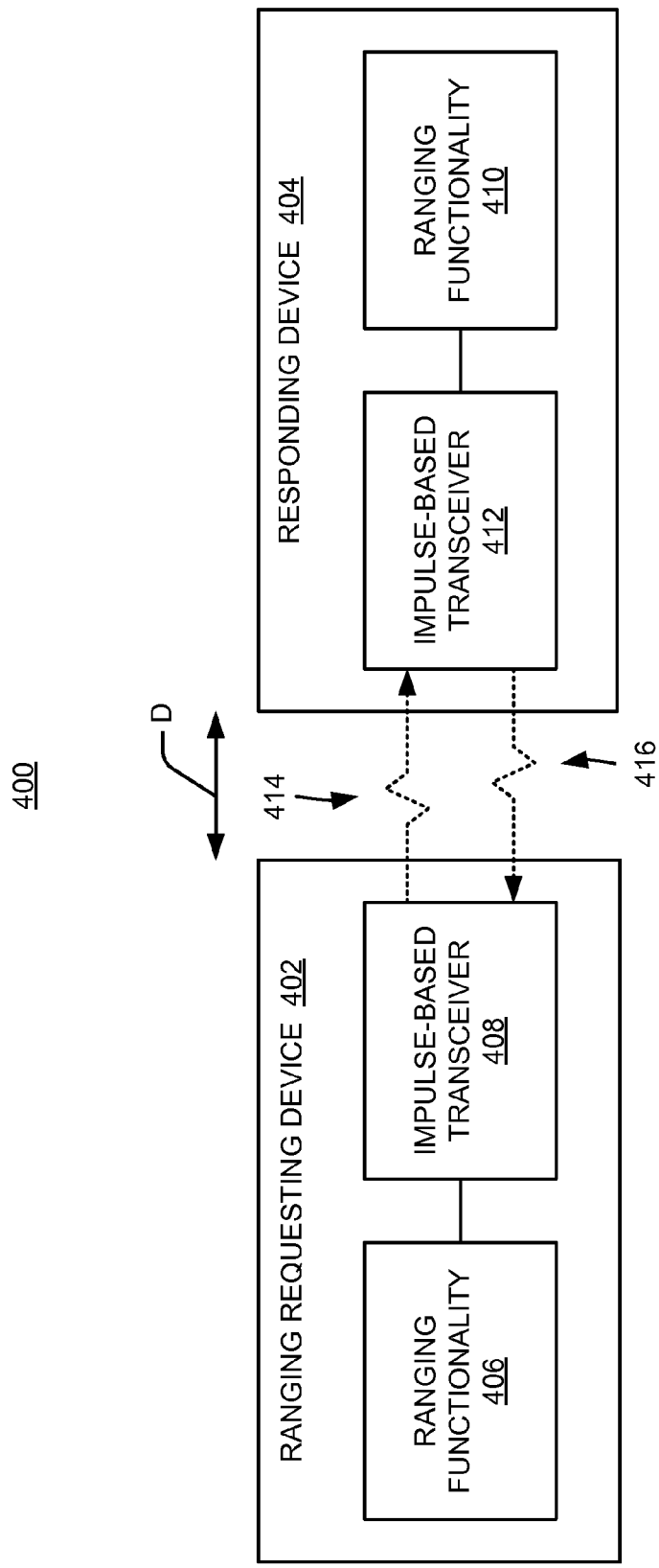
FIG. 4 is a simplified block diagram illustrating an example of a communication system adapted to perform two-way ranging.

For purposes of illustration, additional details of a signal-based gain control scheme as taught herein will be described in the context of a ranging system 400 as shown in FIG. 4. Ranging involves determining a distance between two locations. In a typical scenario, a ranging device measures a distance from the ranging device to another object. Here, the ranging device may determine the amount of time it takes for a signal to travel between the ranging device and the other object. The ranging device may then estimate the distance based on the signal propagation time and the known propagation speed of the signal (e.g., estimated as the speed of light). A ranging device may employ a variety of technologies such as laser, radar, sonar, and various forms of radiofrequency (RF) signaling.

In the example of FIG. 4, devices 402 and 404 in the ranging system 400 are configured to transmit and receive pulses. In some cases, such a communication system may comprise a UWB system where the devices transmit and receive UWB pulses. It should be appreciated, however, that the teachings herein may be applicable to other types of communication systems, frequency bands, and devices.

In an UWB system, pulses with widths on the order of a few nanoseconds or less (e.g., 4 nanoseconds or less) may be used for communication. In addition, these pulses may be transmitted using a relatively low duty cycle (e.g., a pulse may be transmitted on the order of every 200 nanoseconds). The use of such pulses may facilitate accurate ranging measurements. For example, by using relatively narrow pulses, it may be easier to accurately identify the line-of-sight (LOS) path (e.g., the leading edge) of a received pulse. Consequently, a more accurate estimate of the time-difference (e.g., the propagation delay) between when the pulse was transmitted by one device and when the pulse was received by another device may be determined.

In some wireless systems (e.g., a system employing portable UWB devices), it is desirable to utilize low power and/or low cost devices. Such constraints may, however, limit the capabilities of these devices. For example, it may not be feasible to use coherent radios (which may otherwise facilitate precise distance estimation) in ultra-low power and low cost devices because coherent radios may be relatively complex and/or have relatively high power consumption. Consequently, conventional schemes may not provide a desired combination of ultra-low power and precise leading edge detection.

In the example of FIG. 4, the device 402 may initiate a two-way ranging operation to determine a distance D between the devices 402 and 404. In accordance with the teachings herein, the devices 402 and 404 employ a gain control scheme to facilitate leading edge detection. Here, ranging functionality 406 of the device 402 cooperates with an impulse-based transceiver 408 to send messages to and receive messages from the device 404. For example, the device 402 may send messages to the device 404 to request initiation of a ranging operation, provide clock drift information, provide gain control information, and provide ranging data (for leading edge detection). The transceiver 408 sends these messages via a series of pulses as represented by the dashed line 414. Similarly, ranging functionality 410 of the device 404 cooperates with an impulse-based transceiver 412 to send messages to and receive messages from the device 402. For example, the device 404 may send messages to the device 402 to respond to the ranging request, provide gain control information, and provide ranging data (for leading edge detection). The transceiver 412 sends these messages via a series of pulses as represented by the dashed line 416.

Figure 5:
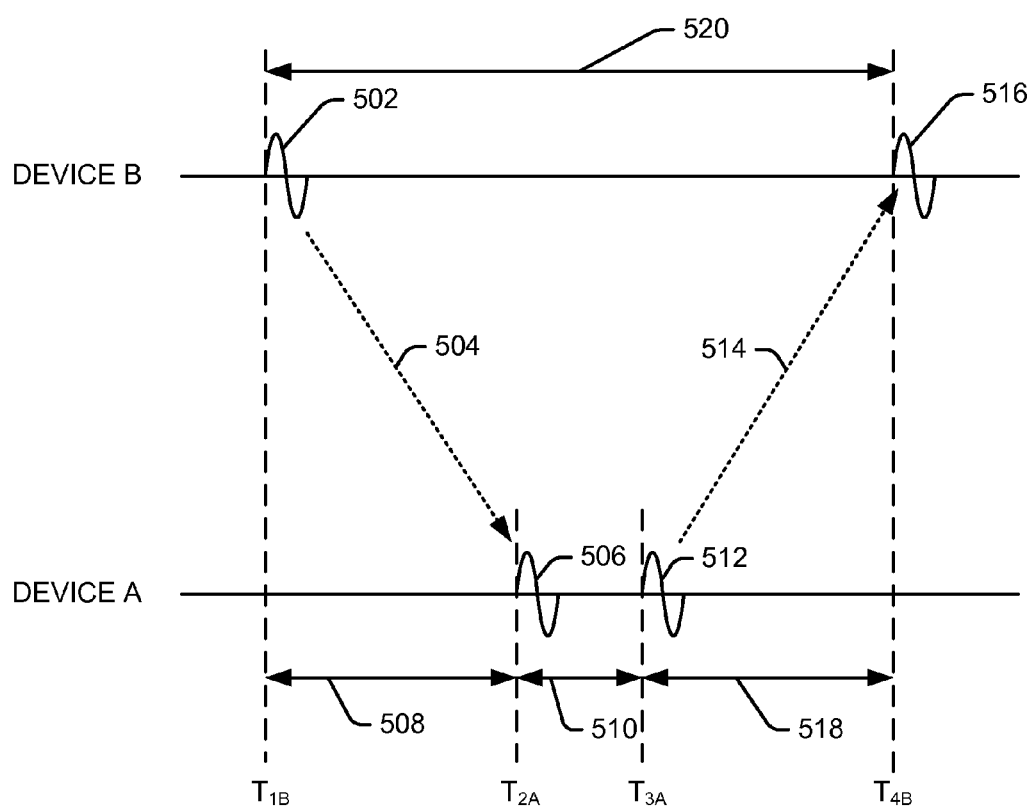
FIG. 5 is a simplified diagram illustrating an example of two-way ranging signaling.

FIG. 5 illustrates a simplified example of ranging signal timing for two devices (e.g., wireless devices) performing a two-way ranging operation. Here, a device A (e.g., the device 402) may determine the distance to a device B (e.g. the device 404) based on a round-trip time associated with signals transmitted by the devices. For example, distance may be estimated based on the equation: $D=T_P*C$, where D is the estimated distance, $T_P$ is the signal propagation delay from one device to the other, and C is the speed of light. The signal propagation delay $T_P$ may be estimated based on the round-trip time as discussed below.

The signals of FIG. 5 are depicted in a simplified form for purposes of illustration. Here, a device B generates a signal 502 that is transmitted over-the-air (as represented by an arrow 504) to a device A. This signal is received at the device A (as represented by a signal 506) after a propagation time represented by a time period arrow 508. Following a turn-around time period (as represented by a time period arrow 510) after receiving the signal 506, the device A generates a signal 512 that is transmitted over-the-air (as represented by an arrow 514) to the device B. This signal is received at the device B (as represented by a signal 516) after a propagation time represented by a time period arrow 518. Each device generates a timing indication (hereafter referred to, for convenience, as a timestamp) associated with the transmission and reception of these signals. For example, the devices A and B may record transmit timestamps at $T_{3A}$ and $T_{1B}$, respectively, and the devices A and B may record receive timestamps at $T_{2A}$ and $T_{4B}$, respectively. Based on these timestamps, an estimated propagation delay $T_P$ (e.g., corresponding to time period arrow 508 or 518) may be computed. For example, a round-trip time estimate may be determined according to: $2T_P=(T_{4B}-T_{1B})-(T_{3A}-T_{2A})$. Here, $T_{1B}$, $T_{2A}$, $T_{3A}$, and $T_{4B}$ are measurable. In addition, device B may send to device A an indication of the time period between $T_{1B}$ and $T_{4B}$ (represented by a time period arrow 520) measured by device B. Consequently, device A may calculate the round-trip time based on the indication received from device B (the time period arrow 520) and the turnaround time measured by device A (the time period arrow 510).

As indicated in the above example, the initial timestamps may not be of sufficient precision to provide the desired ranging accuracy (e.g., sub-foot accuracy). For example, the pulse detection scheme used to generate the initial timestamps may employ a conventional signal detection scheme (e.g., that detects a signal maximum). However, to achieve precise ranging measurements, it is desirable to detect the leading edge of a received signal. Accordingly, as discussed in detail below, more precise leading edge detection may be employed to identify the leading edge of a received pulse.

Figure 6:
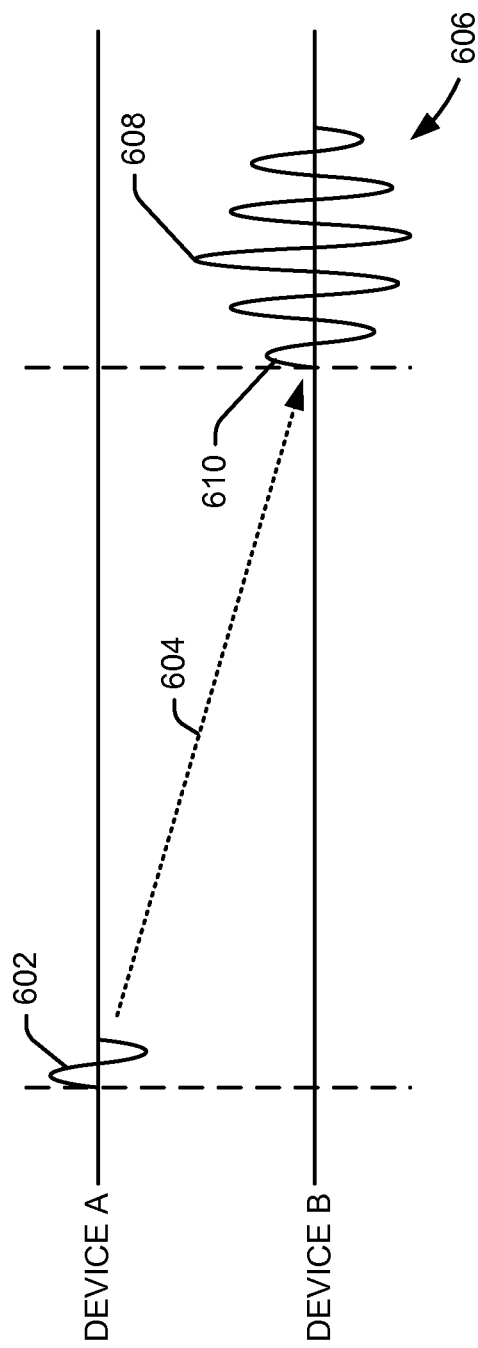
FIG. 6 is a simplified diagram illustrating an example of detection of a leading edge of a pulse.

FIG. 6 illustrates how leading edge detection may differ from conventional signal detection (e.g., which may be used by the devices A and B for data communication operations). Here, the device A sends a pulse 602 that is transmitted (as represented by arrow 604) to the device B. The pulse 606 represents the received pulse at device B. In conventional signal detection, the typical acquisition point may correspond to the strongest signal path. Thus, for data communication purposes, the pulse 606 may be acquired at or near point 608.

To determine the signal propagation delay time with a high degree of accuracy for ranging, it is desirable to locate the leading edge 610 of the pulse 606. In a multi-path scenario, however, the leading path (e.g., LOS path) of a pulse may be attenuated. Since the leading path may be weaker than other paths under these circumstances, detection of the strongest signal path may not identify the leading edge of the pulse. FIGS. 7-16 describe how a signal-based gain control scheme may be employed to facilitate accurate leading edge detection in a ranging system.

Figure 7:
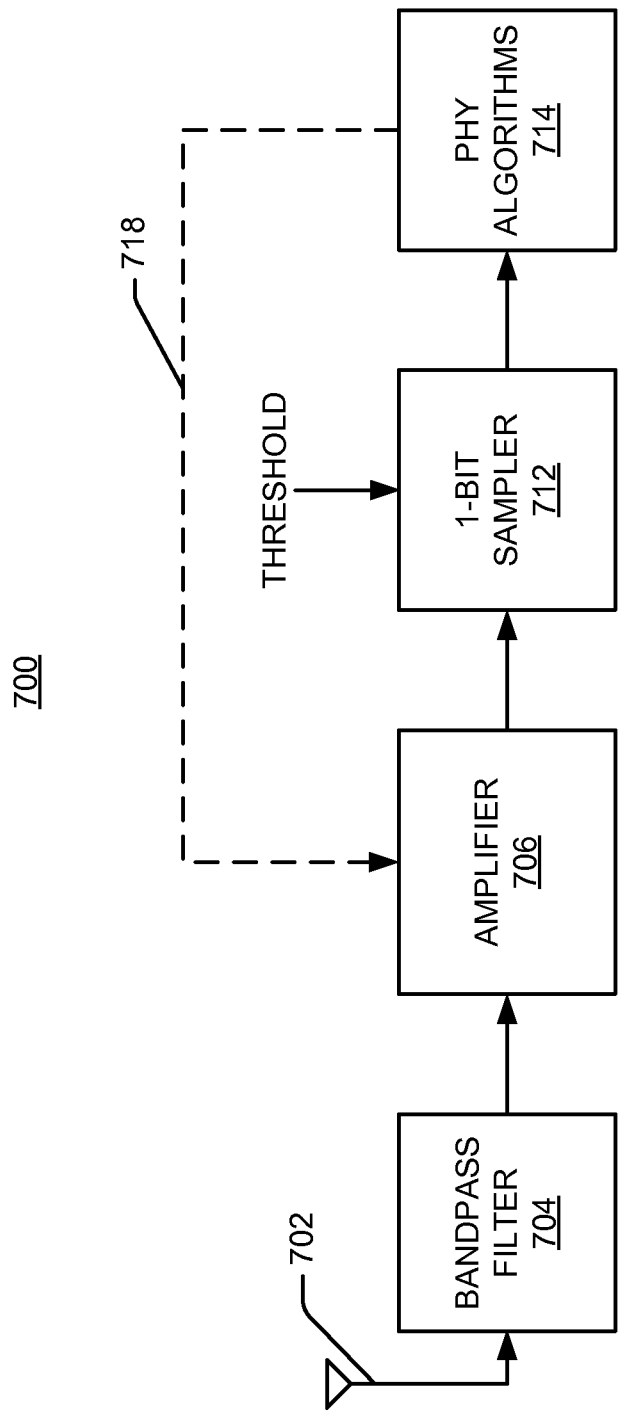
FIG. 7 is a simplified block diagram illustrating an example of receive chain components and PHY algorithms.

FIG. 7 depicts sample components that may be employed in a wireless device 700 to receive pulses. In particular, FIG. 7 depicts a receive chain including components 702-712, and PHY algorithms 714 that may be employed to control the receive chain. An RF signal received at an antenna 702 is filtered by a bandpass filter 704 and provided to a one or more amplifiers as represented by the amplifier 706 (e.g., a stepped-gain low noise amplifier and/or a variable gain amplifier). The amplifier 706 amplifies this signal based on a control signal 718. The output of the amplifier is sent to a 1-bit sampler 712 (e.g., a 1-bit ADC or some other suitable sampler) that samples the signal at a defined rate. In some implementations, the sampler threshold may be set (e.g., via the amplifier 706) such that 9% of the received samples are equal to 1 in the absence of an input signal.

In some aspects, the PHY algorithms 714 process the digital samples (slices) output by the sampler 712 to determine one or more gain levels for receiving signals. For example, the PHY algorithms 714 may generate the control signal 718 to cause different sets of signals to be received at different gain levels. Based on analysis of these sets of signals as discussed herein, the PHY algorithms 714 may generate the control signals 718 to set at least one gain level for receiving subsequent signals.

In the receive architecture of FIG. 7, it is desirable for system performance to be sufficiently robust to changes in the SNR of the signal path (e.g., channel), changes in transmit/receive parameters, and channel realization. However, factors such as jitter and quantization may adversely affect the performance of the system. For example, the total jitter in an RF transmit/receive chain may be comparable to the propagation delay $T_P$.

In some implementations, multiple pulses may be averaged to reduce the effect of the jitter. For example, signal reconstruction may be performed by averaging a set of pulses according to the following equation:

$$r(k) = \frac{1}{N_P} \sum_{P=1}^{N_P} s(p, k)$$

In the above equation, k is the slice index (e.g., k=1, 2, ..., 24), $N_P$ is the number of pulses, p is the pulse index (e.g., p=1, 2, ..., $N_P$), and $s(p, k) \in \{0, 1\}$.

As mentioned above, the SNR of the signal path also may affect the accuracy of the ranging calculation. For example, a received pulse may be a function of the path gain and noise in the path which may be unknown at the receiver. If a fixed threshold is used for quantization, then the width of a pulse after quantization depends on the SNR. In addition, successive paths may not be distinguishable from one stronger path.

In view of the above, several considerations may be taken into account when implementing a ranging scheme. For example, a quantization step may be implemented to allow an accurate reconstruction of the pre-quantization signal. Also, the quantization step may be designed to provide some robustness to channel realization. However, it may be sufficient to only reconstruct the part of the signal that corresponds to the first path. In addition, for a signal path channel, an optimum threshold may be defined based on the maximum magnitude of the input signal.

In a multi-path scenario (e.g., where a transmitted signal is refracted), on the other hand, the LOS path may or may not be the strongest path. For example, the LOS path may be attenuated by an obstruction in the path such that a reflected path (non-LOS path) may be the strongest path. Accordingly, a received signal may have multiple lobes where a leading lobe may have a lower peak amplitude than a later lobe. Similarly, a received signal may have multiple signal path components (but does not have readily distinguishable lobes) where a leading signal path component may have a lower peak amplitude than the overall signal.

In accordance with the teachings herein, a ranging algorithm with signal-based gain control may be employed to provide accurate ranging measurements in light of the considerations and mitigating factors discussed above. The ranging algorithm produces an estimate of the time of arrival of a received pulse by processing the slices of a number $N_P$ of successive transmitted pulses. Here, the gain level (e.g., an AGC level) may be set based on the signal level and may be changed during the reception of pulses according to a defined scheme.

The ranging algorithm involves two primary algorithms: a signal-based gain control algorithm and a core ranging algorithm. In some aspects, the signal-based gain control algorithm determines one or more receive gain levels to be used by the core ranging algorithm during leading edge estimation. For example, the signal-based gain control algorithm may determine an appropriate quantization threshold (or set of thresholds) by processing sets of pulses that are received using different gain levels. The core ranging algorithm then identifies the leading edge associated with a received pulse by quantizing the received pulse using the quantization threshold(s).

Figure 8:
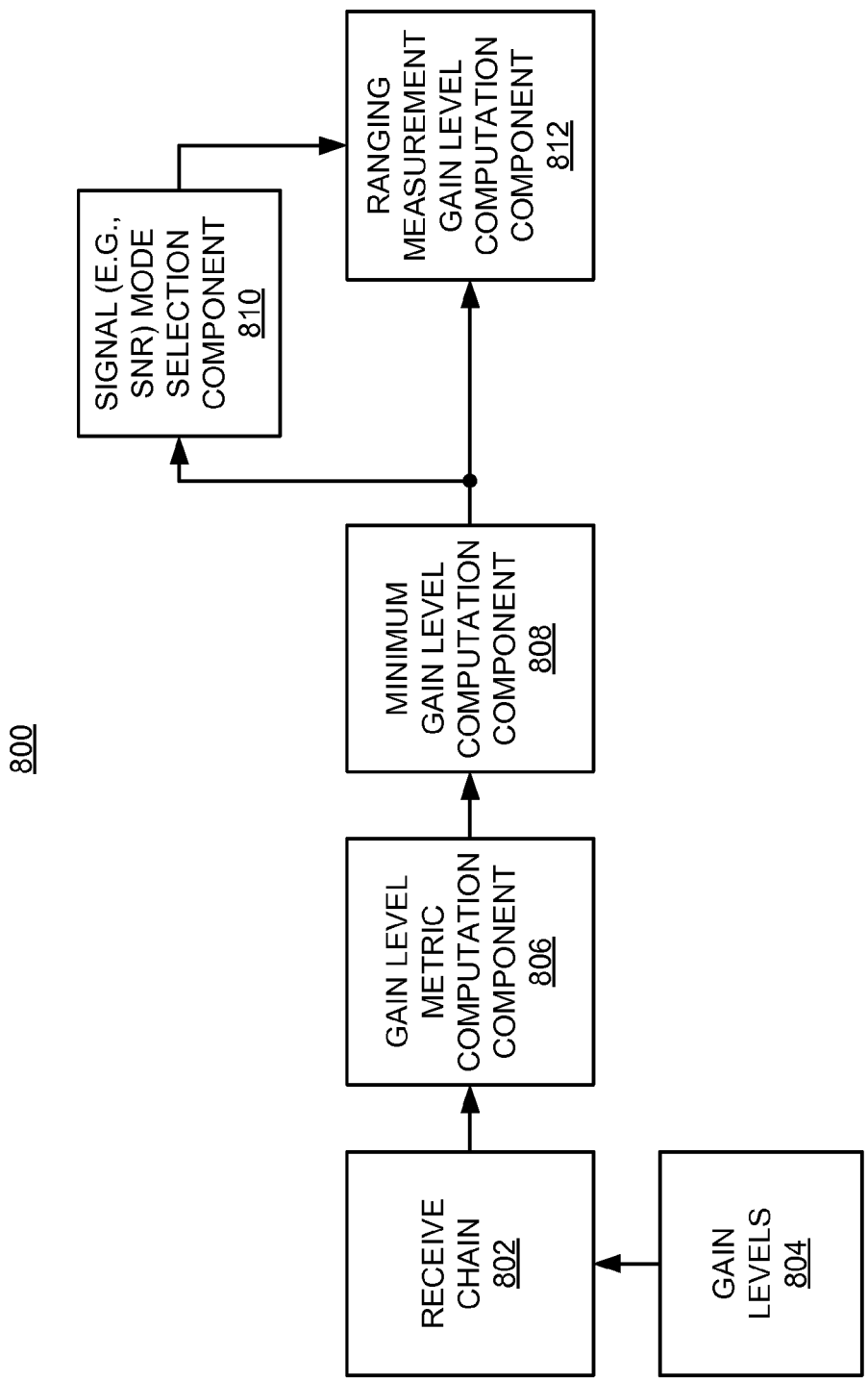
FIG. 8 is a simplified block diagram illustrating an example of components for determining at least one gain level.

FIG. 8 illustrates sample functionality 800 for implementing a signal-based gain control algorithm in a device. A first sequence of pulses from another device (not shown) is received by a receive chain 802 of the device. The receive chain receives different sets of these pulses at different gain levels 804.

At components 806 and 808, the pulses are processed to determine a minimum gain level (e.g., a minimum AGC level or target AGC level) such that a signal is detectable at the device (i.e., a level that provides adequate received signal detection). For example, a minimum gain level may be specified as the smallest gain level that results in sufficient detection of the pulse. In some aspects, sufficient pulse detection may correspond to a quantization threshold that is below the peak of the pulse within a certain margin. Accordingly, in some aspects, this operation may involve identifying the peak of a received pulse (e.g., a reconstructed "pulse" based on the average of the samples of a set of the received pulses). For example, the peak of the received pulse may be identified by quantizing the received pulses at different gain levels and generating gain metrics that indicate whether the quantization thresholds for those gain levels are near the peak of the received pulse.

A gain level metric computation component 806 generates a set of gain level metrics based on the corresponding sets of pulses received at each gain level. For example, a different gain level metric may be generated for each gain level. In some aspects, a gain level metric may provide an indication of whether a pulse may be reliably sampled at that gain level. For example, a gain level metric may provide an indication of the number of '1s' sampled (or the number of times a sample threshold was exceeded) when receiving one or more pulses at a corresponding gain level. Accordingly, a gain metric may indicate whether the quantization threshold for a given gain level is above or below the peak of the received pulse and, in some aspects, how far the quantization threshold level is above or below the peak.

A minimum gain level computation component 808 then computes the minimum gain level based on the gain level metrics. For example, the lowest gain level that has a gain metric that indicates that the pulse was sufficiently detectable at that gain level may be selected here.

Different methods may be used during this stage of the algorithm. For example, in some implementations a device uses all gain levels in an interval of interest and determines the minimum gain level after processing all slices. In other implementations, the device may use a binary search.

At components 810 and 812, using the minimum gain level, the device determines a set of gains that will be used for the reception of a second sequence of pulses from the other device. For example, in some implementations up to three gain levels are used in the second stage, each of which is used for the reception of 40 pulses. Here, a signal mode (e.g., SNR mode) selection component 810 determines a signal mode based on the minimum gain level. For example, a SNR mode may be set to 0, 1, or 2 if the minimum gain level is high, medium, or low, respectively. A ranging measurement gain level computation component 812 computes the gain levels to be used for receiving the second sequence of pulses. In other words, the component 812 determines the thresholds (e.g., via AGC gain levels) that are used to quantize the second pulse sequence. Here, since it is desirable to detect a weaker LOS path when such a path is present, the gain levels are specified to detect the pulse below the peak of the pulse. Moreover, through the use of multiple gain levels at this stage (e.g., resulting in a different effective quantization threshold at each level), information about the shape of the pulse may be acquired.

Figure 9:
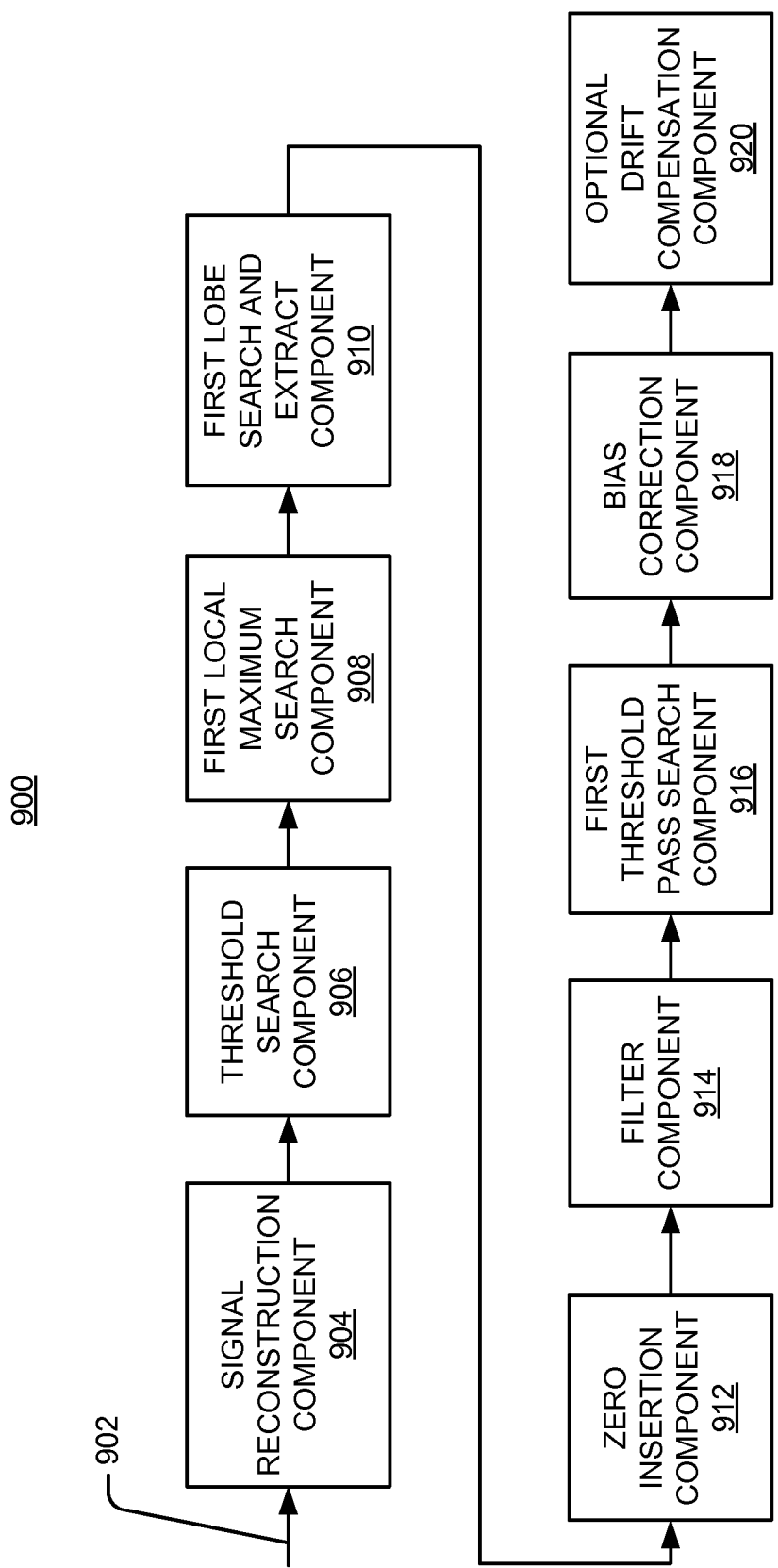
FIG. 9 is a simplified block diagram illustrating an example of components for performing operations relating to identifying a leading edge of a signal.

FIG. 9 illustrates sample functionality 900 for implementing a core ranging algorithm. In this example, the core ranging algorithm uses the signal mode provided by the component 810, the gain levels from the component 812, and the slices of the second sequence of pulses as provided via the receive chain 802.

A signal reconstruction component 904 receives the slices (represented as inbound on the line 902) and combines them to provide a reconstruction of the original signal (e.g., a reconstructed "pulse" corresponding to the second sequence of pulses). In other words, the resulting reconstruction is an approximation of the received waveform sampled at the defined slice period (e.g., 0.5-2 nanoseconds). The signal reconstruction may take various forms. For example, in some implementations, the received slices obtained using a given threshold (e.g., gain level) are averaged and these averaged signals for each threshold are combined (e.g., with weighting) to provide the reconstructed signal.

The remaining blocks of FIG. 9 illustrate a sequence of processing operations performed on the signal reconstruction to identify the leading edge. Initially, a threshold search component 906 performs a thresholding operation on the signal reconstruction (e.g., to eliminate any samples at or below a noise floor). In some aspects, this threshold may be a function of the minimum gain level and/or the maximum value of the signal reconstruction. After the thresholding operation, a first local maximum search component 908 searches for the first local maximum of the signal reconstruction. A first lobe search and extract component 910 uses the signal reconstruction and the identified first local maximum to identify and extract the lobe around the first local maximum. The resulting lobe waveform is then processed by a zero insertion component 912 (e.g., to provide finer resolution) and a filter component 914 (e.g., a low pass filter) to provide an upsampled signal.

A first threshold pass search component 916 identifies the leading edge (e.g., pulse arrival time) as the first point where the upsampled signal exceeds a threshold. In some aspects, this threshold may be determined as a function of the maximum amplitude of the upsampled signal (the signal reconstruction). For example, system requirements may dictate that paths that are a defined level (e.g., 10 dB-3 dB) below the strongest path are to be detectable. Thus, the threshold may be set below the maximum amplitude by a specified amount (e.g., a defined dB level lower, at a midpoint, etc.). In some aspects, the threshold may be set so that a weaker path (e.g., a weaker LOS path) is detectable. For example, to account for a situation where an earlier weaker signal may be masked within a larger later signal, the threshold may be set at a relatively low percentage (e.g., 10%-45%) of the maximum pulse amplitude in an attempt to ensure that the leading edge is based on the earlier signal rather than the later signal. In some aspects, the threshold may be specified based on a received signal mode (e.g., SNR mode). For example, in the event a relatively small signal is received (e.g., low SNR), the threshold may be set just below the peak of the received signal (e.g., just above the noise floor).

In some implementations a bias correction component 918 may be employed to compensate for bias introduced by the above operations. For example, bias may be induced by the presence of saturation and/or bias may depend on the minimum gain level (e.g. SNR mode) selected above. As an example of the latter case, pulses of different amplitude (e.g., associated with different SNR) may have different slopes which, in turn, may affect the identification of (e.g., estimation of) the timing of the leading edges of these pulses. Thus, bias correction may be employed to account for the slight differences in leading edge times that the algorithm may calculate for these different types of signals. In some implementations, bias is compensated through the use of a look-up table. Here, each threshold scheme may be associated with a bias correction value. In some implementations, the bias correction method may be based on the maximum of the upsampled signal. Such a method may be able to substantially (e.g., completely) remove the bias for a weaker first path that is spaced far enough from the next path.

In some implementations, a drift compensation component 920 may be employed to estimate and compensate for clock drift between the devices. In other implementations, however, there may be relatively little performance degradation due to clock drift. For example, the clock drifts of two devices may tend to compensate each other. Consequently, drift compensation may not be used in some implementations.

Additional details relating to operations that may be performed by the components of FIGS. 8 and 9 or other suitable components will now be described with reference to the flowchart of FIGS. 10-12. In a sample implementation, an estimate of the time of arrival is computed in units of the slice sampling interval.

Figure 10:
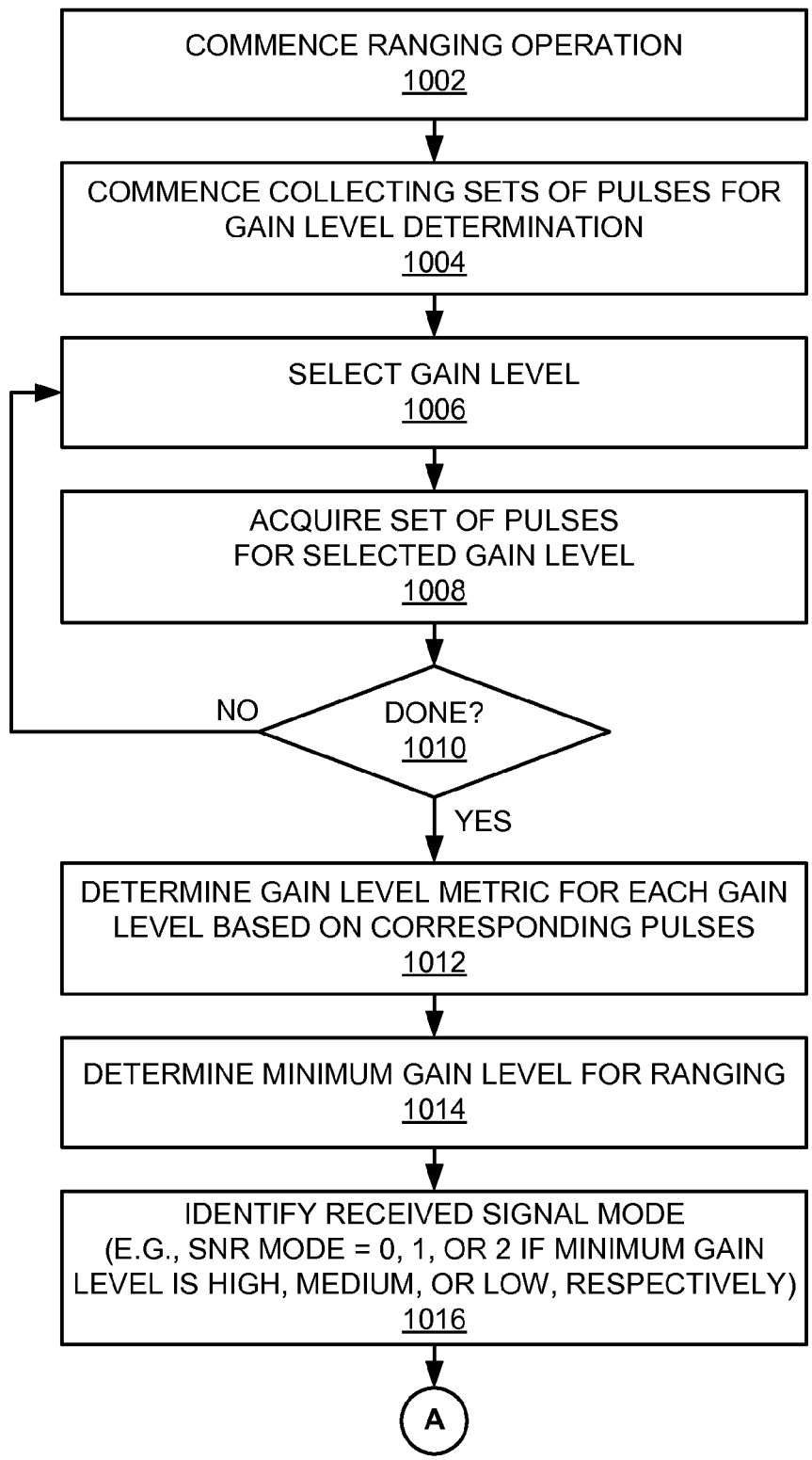
FIGS. 10-12 are a flowchart of several sample aspects of ranging-related operations that may be performed in conjunction with signal-based gain control.

Referring initially to FIG. 10, as represented by block 1002, at some point in time a two-way ranging operation is commenced at a device. For example, the device may send a request to initiate ranging operations to another device and the other device may send a corresponding response (e.g., accepting the request). Upon commencement of ranging operations, the devices may initiate ranging-specific gain control operations. In some aspects, these operations may be invoked to facilitate accurate leading edge detection. For example, during normal communication operations between devices, gain control may not be employed or a relatively simple form of gain control may be employed (e.g., to maintain low power consumption). However, to facilitate highly accurate leading edge detection (e.g., to enable ranging accuracy on the order of one foot or less), a more robust form of gain control (e.g., signal-based gain control) may be invoked during ranging operations. Upon initiation of such gain control operations, each device transmits sets of pulses to the other device. These pulses may comprise, for example, defined symbol sequences (e.g., pseudorandom sequences) known by the first and second devices.

As represented by block 1004, a device commences collecting (e.g., sampling) sets of pulses for the gain level determination operation. As represented by block 1006, a gain level is selected for receiving one set of pulses. As represented by block 1008, the set of pulses received at that gain level are acquired. Here, the device may sample over the periods of time at which it is expected that pulses should arrive at the device (e.g., based on the pulse repetition period, the interpulse period, and time hopping). For example, in the event ten pulses were received during ten sampling windows, a set of ten pulses may be sampled to provide ten sample vectors representative of the pulses for that gain level. As represented by block 1010, the operations of blocks 1006 and 1008 are repeated for different gain levels. Thus, for each gain level of a defined set of gain levels, a plurality of pulses may be acquired over a set of sample positions.

As represented by block 1012, a gain level metric is determined for each gain level based on the pulses received for that gain level. In a sample implementation, the gain metric computation may comprise a two step process.

Figure 13:
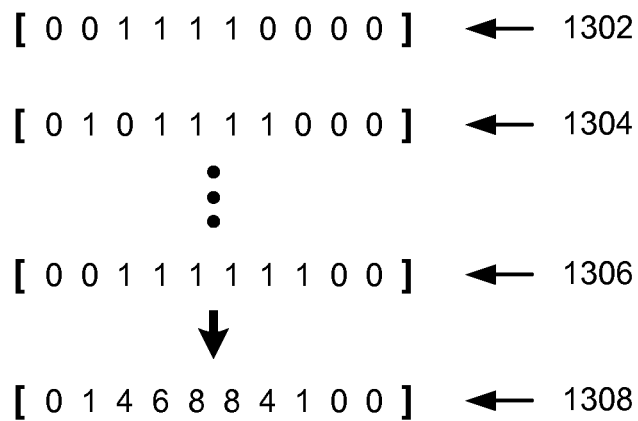
FIG. 13 is a simplified diagram illustrating an example of vector generation.

At a first step, the samples for each pulse position may be added to provide a sum vector that indicates how many '1s' were received in each pulse position (e.g., indicates the probability of getting a '1' in each sample position). FIG. 13 illustrates an example of how such a vector may be generated. Here, the vectors 1302, 1304, and 1306 and the associated ellipse represent ten pulse vectors that were acquired for a given gain level. In this simplified example, each pulse is shown as being sampled at ten sample positions. The vector 1308 represents the sum vector that indicates how many 1s were received in each sample position for that gain level. Thus, each element of such a vector may correspond to one of the sample positions.

At a second step, for each gain level, it is determined how many of the elements of the corresponding sum vector are greater than or equal to a threshold (e.g., greater than 3). In some aspects, this threshold may correspond to a level that has been defined (e.g., determined empirically and/or through simulation) to represent a high probability that a pulse was present at that sample position. Referring again to the sum vector 1308 of FIG. 13, the gain level metric for this vector is 5 for the case where the threshold to be exceeded is 3, since 5 of the sample positions exceed this threshold. Similar gain level metrics are thus calculated for each of the gain levels. Consequently, a gain level metric vector may be generated from this metric data whereby consecutive elements contain the metrics for corresponding consecutive gain levels. As an example, a gain level metric vector may take the form: [9, 9, 9, 8, 8, . . . , 2, 1, 1, 1, 0, 0, 0] where the vector elements from left to right correspond to successively lower gain levels.

Figure 14:
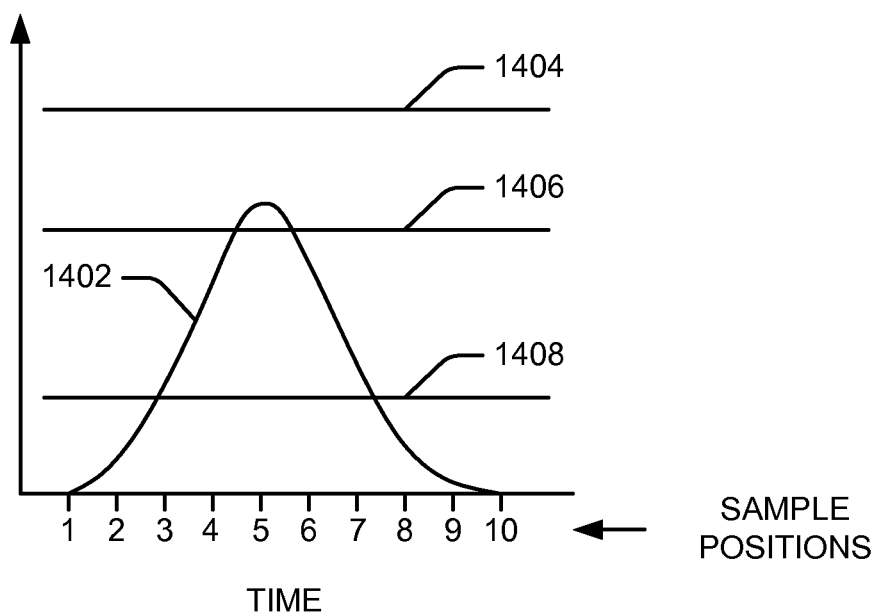
FIG. 14 is a simplified diagram illustrating, in a conceptual manner, an example of how a minimum gain level may be determined.

As represented by block 1014 of FIG. 10, a minimum gain level is determined from the gain level metrics. In some implementations, this involves determining a minimum gain level that may be used to reliably detect a pulse. For example, FIG. 14 illustrates a sample pulse 1402 and lines 1404-1408 that correspond to different gain levels. Here, the line 1404 represents that at a corresponding gain level, the pulse 1402 would not be detected (e.g., would not exceed a threshold) at any sample positions. The line 1406 represents that at a corresponding gain level (e.g., a higher gain level), the pulse 1402 would be detected (e.g., would exceed a threshold) at a single sample position: position 5. The line 1408 represents that at a corresponding gain level (e.g., an even higher gain level), the pulse 1402 would be detected at several sample positions: positions 3-7.

Accordingly, a minimum gain level may be determined by identifying the last non-zero element of the gain level metrics vector. For example, in the vector [9, 9, 9, 8, 8, . . . , 2, 1, 1, 1, 0, 0, 0], the gain level corresponding to the rightmost 1 may be selected as the minimum gain level. Thus, in some aspects, this operation involves identifying the peak of the pulse.

As represented by block 1016 of FIG. 10, a received signal mode (e.g., an SNR mode) is identified based on the minimum gain level. For example, if the minimum gain level is low (e.g., below a defined threshold), a high SNR mode may be indicated (e.g., SNR mode=2). If the minimum gain level is at a medium level (e.g., between defined thresholds), a medium SNR mode may be indicated (e.g., SNR mode=1). If the minimum gain level is high (e.g., above a defined threshold), a low SNR mode may be indicated (e.g., SNR mode=0). Thus, in some aspects, the signal mode may be indicative of a peak amplitude associated with a received pulse.

Figure 11:
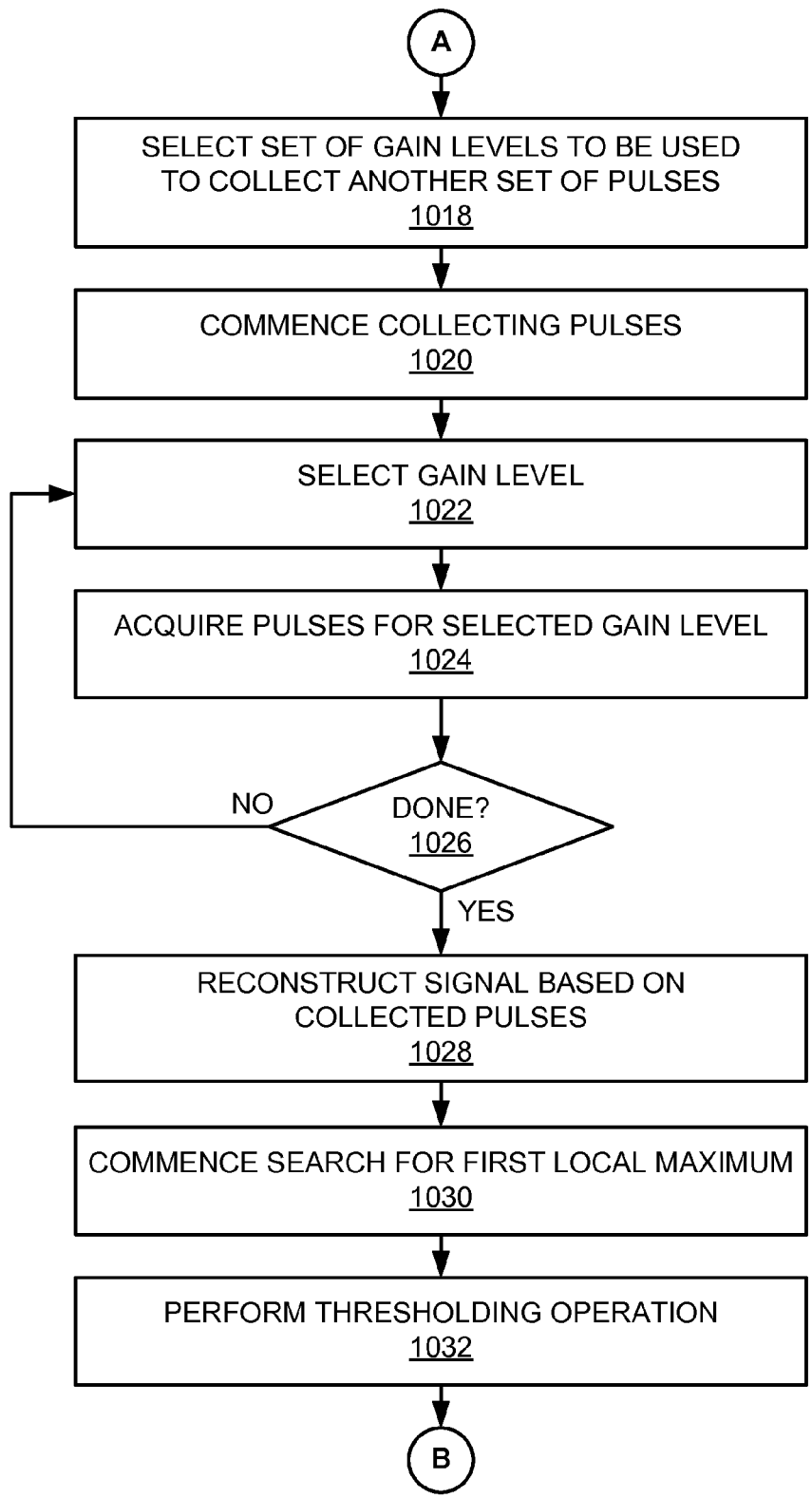

Referring now to FIG. 11, as represented by block 1018, a set of gain levels (e.g., comprising 3 gain levels) is selected based on the received signal mode. For example, one set of gain levels may be selected for SNR mode 0, another set of gain levels may be selected for SNR mode 1, and yet another set of gain levels may be selected for SNR mode 2. The set of gain levels may be defined, for example, based on empirical tests and/or simulations that indicate optimum gain levels for different SNR conditions. Also, this set of gain levels typically consists of a subset of the gain levels used at blocks 1006 and 1008.

The gain levels selected at block 1018 are used to collect another set of pulses commencing at block 1020. As represented by block 1022, one of the gain levels from block 1018 is selected for receiving one set of pulses (e.g., 40 pulses). As represented by block 1024, the set of pulses received at that gain level are acquired. For example, a set of 40 pulses may be sampled to provide 40 sample vectors representative of the pulses for that gain level. These pulses may then be averaged to provide a representative pulse vector. As represented by block 1026, the operations of blocks 1022 and 1024 are repeated for the different gain levels specified by block 1018.

FIG. 15 illustrates an example where a received pulse 1502 is sampled at three different gain levels. In this example, the received pulse 1502 comprises a smaller early signal (e.g., the LOS path) and a larger later signal (e.g., a reflected signal) due to, for example, refraction of the transmitted pulse and attenuation in the LOS path. The lines 1504-1508 represent where the pulse 1502 would cross a threshold at each gain level. Specifically, the line 1504 represents that at a corresponding gain level, the pulse 1502 would be detected (e.g., would exceed the threshold) at pulse positions 6 and 7. The corresponding samples are represented by the vector 1510. The line 1506 represents that at a corresponding gain level (e.g., a higher gain level), the pulse 1502 would be detected at sample positions 3, 5, 6, 7, and 8. The corresponding samples are represented by the vector 1512. The line 1508 represents that at a corresponding gain level (e.g., an even higher gain level), the pulse 1502 would be detected at sample positions 2-9. The corresponding samples are represented by the vector 1514.

As represented by block 1028 of FIG. 11, a reconstruction representative of the input pulse is generated based on the samples collected at the different gain levels. For example, respective sample positions of the averaged vector generated for each gain level at blocks 1022-1026 may be combined to provide a reconstructed signal 1516 (FIG. 15). In some implementations, the vectors associated with different gain levels may be weighted differently. For example, the averaged vector for the first gain level may be weighted by a first weight, the averaged vector for the second gain level may be weighted by a second weight, and so on, whereby the resulting weighted vectors are summed to generate a reconstructed signal.

Figure 12:
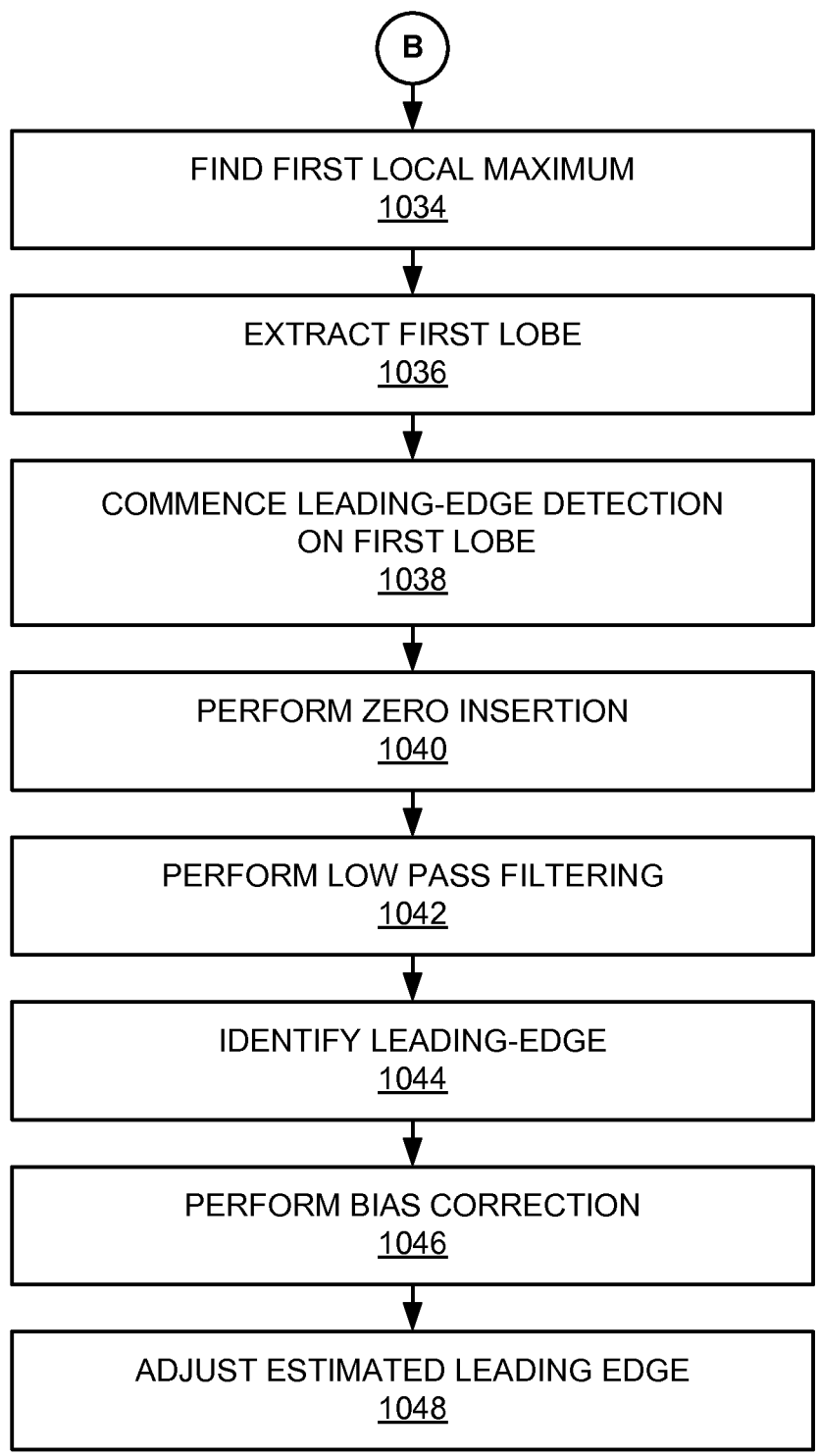

Blocks 1030-1034 of FIGS. 11 and 12 involve searching for a first local maximum in the reconstructed signal. This provides a coarse location of the leading edge. As represented by block 1032, a thresholding operation may be performed to, for example, remove samples below a noise floor from the constructed signal. FIG. 16 illustrates an example where a threshold 1602 is applied to a reconstructed signal 1604 to eliminate samples below the threshold 1602, thereby providing a reconstructed signal 1606.

As represented by block 1034 of FIG. 12, a first location maximum of the reconstructed signal is then located. For example, in FIG. 16 the first local maximum is in the vicinity of the third sample.

As represented by block 1036 of FIG. 12, a first signal lobe associated with the first local maximum is identified and extracted. For example, in FIG. 16 the first lobe may comprise the second, third, and fourth samples.

Blocks 1038-1044 of FIG. 12 involve identifying a leading edge of the first lobe. As represented by block 1040, the first lobe is upsampled via a zero insertion operation to provide lobe data at a higher resolution. The resulting data is then filtered as represented by block 1042.

As represented by block 1044 of FIG. 12, a leading edge of the lobe (and, hence, the LOS leading edge of the pulse) is identified. For example, the leading edge of the pulse may be identified (e.g., the timing of the leading edge estimated) by determining where the leading edge of the higher resolution lobe crosses a threshold. In some implementations this threshold may be defined based on the received signal mode (e.g., SNR mode). For example, for a low SNR mode, the leading edge may be defined just below the peak of the pulse.

As represented by block 1046 of FIG. 12, the leading edge identified at block 1044 is corrected for bias. In some implementations this bias correction may be based on the received signal mode (e.g., SNR mode).

As represented by block 1048 of FIG. 12, an initial timestamp acquired during the ranging procedure may be refined to more precisely reflect the timing of the true leading edge as determined at blocks 1044 and 1046. Also, RF delay calibration may be employed in some implementations.

The output of the core ranging algorithm is an estimate of the parameter $(T_{3A}-T_{2A})$ in device A and an estimate of the parameter $(T_{4B}-T_{1B})$ in device B. These parameters may then be used to determine the distance between the devices as discussed herein.

Through the use of the above techniques, highly accurate, yet cost-effective ranging may be achieved. For example, the above techniques may enable precise detection of a leading edge in a relatively simple and low power (e.g., non-coherent) receive architecture that employs 1-bit sampling (one-bit quantization).

In some aspects, the disclosed techniques provide better performance by taking received signal levels (e.g., SNR modes) into account. For example, differences in system response (e.g., that may affect the leading edge estimate) that result from different received signal levels (e.g., associated with different received signal SNR levels) may be compensated for by using different parameters for different SNR modes. Accordingly, similar leading edge times may be measured for a received signal from another device irrespective of whether the received signal has a small amplitude or a large amplitude. Also, the disclosed techniques provide a relatively efficient (e.g., low power and cost) method of leading edge detection since a leading edge may be detected by processing a relatively small number of samples.

The parameters described above may be defined in a variety of ways. For example, parameters such as SNR modes, SNR thresholds, selected gain levels, bias compensation parameters, gain metric thresholds, quantization thresholds, table values, and so on, may be defined based on empirical tests and/or simulations that attempt to identify optimal parameter values. In some aspects, an optimal parameter may be one that provides the best system performance (e.g., the most accurate ranging results, the most accurate leading edge detection, and so on).

Figure 17:
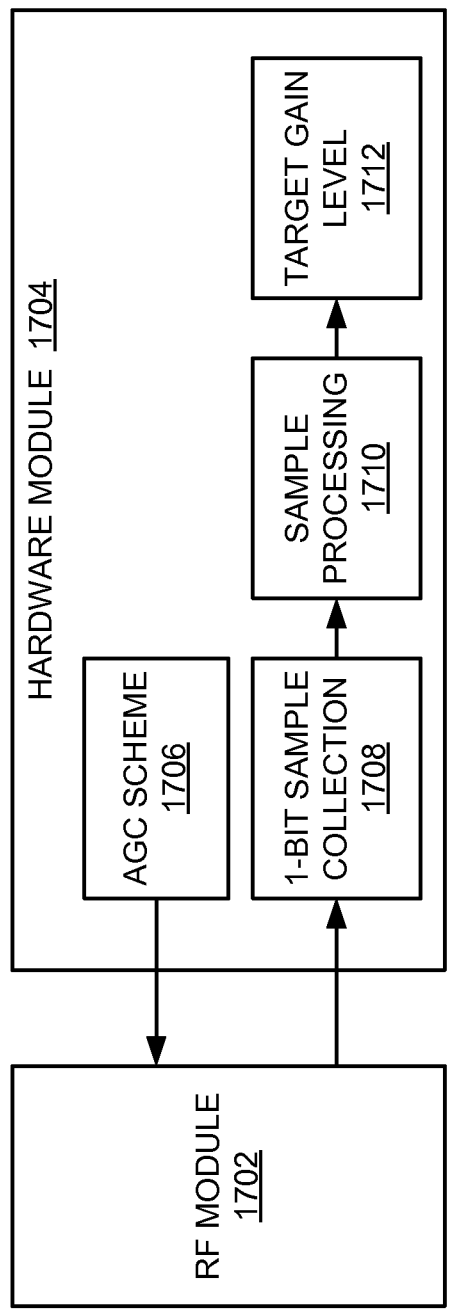
FIGS. 17 and 18 are simplified diagrams illustrating an example of how components may be implemented in an RF module, a hardware module, and a software module.
Figure 18:
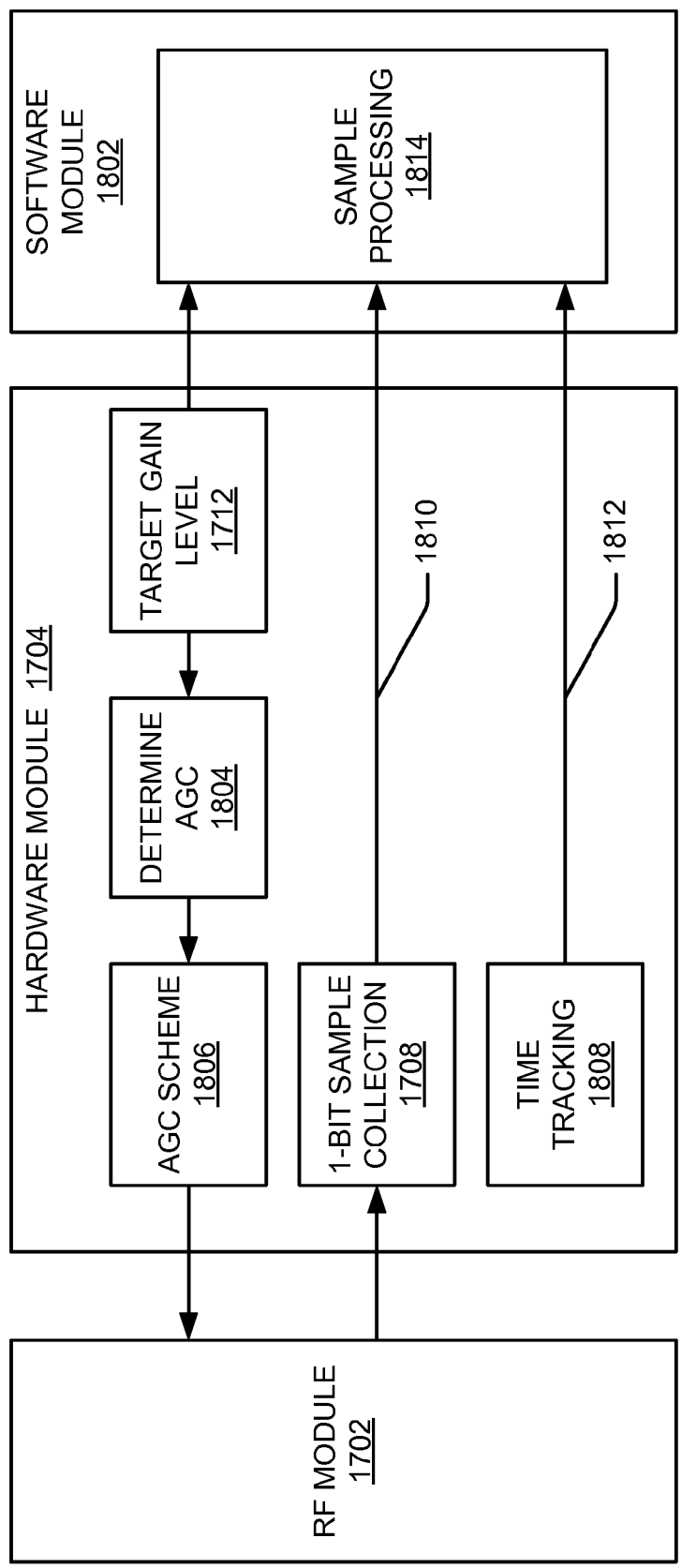

The components described herein may be implemented in various ways. FIGS. 17 and 18 illustrate an implementation that includes an RF module 1702, a hardware module 1704 (e.g., a field programmable gate array (FPGA)), and a software module 1802 (e.g., an ARM).

Referring initially to FIG. 17, the hardware module 1704 has a preloaded scheme of gains (represented by the AGC scheme 1706) that are used by the RF module 1702 to receive a sequence of pulses. The samples from the sequence are stored in and processed in the hardware module 1704. Specifically, a 1-bit sample collection component 1708 samples the pulse sequence and provides the resulting samples to a sample processing component 1710. One result of this processing is a target gain level 1712 which is stored in the hardware module 1704.

Referring now to FIG. 18, the hardware module 1704 (i.e., a determine AGC component 1804) uses the target gain level 1712 to determine the scheme of gain levels (AGC scheme 1806) that are used by the 1-bit sample collection component 1708 during the reception of a subsequent sequence of pulses.

The hardware module 1704 also sends the target gain level 1712 to the software module 1802.

The hardware module 1704 includes a time tracking component 1808 to estimate clock drift, after which the hardware module 1704 sets the time tracking component 1808 to an open loop mode. In the open loop mode, the time tracking component 1808 uses the value of the drift determined at the previous step and does not update this value during the pulse reception process. The hardware module 1704, with the time tracking component 1808 in the open loop mode, receives the subsequent sequence of pulses using the gain scheme (AGC scheme 1806) that was defined as a function of target gain level 1712. The samples collected at this step are passed to the software module 1802 as represented by the line 1810. Optionally, these samples may undergo some minimal processing in the hardware module 1704.

If the device performs time tracking, information related to the time tracking process may be passed to the software module 1802 as represented by the line 1812. This information may comprise, for example, the estimated drift and the hopping and data sequences that are transmitted and/or received.

A sample processing component 1814 of the software module 1802 processes the received samples. The target gain level 1712 is used as input parameter (e.g., for determining a threshold). The time tracking indications also may be used for extra drift compensation.

The software module 1802 sends the result of the sample processing to the MAC layer (not shown). The MAC layer may send the result to the other device using a data channel. If the device performs time-tracking, time tracking indications related to the transmitting process may be sent to the software module 1802 as well.

Figure 19:
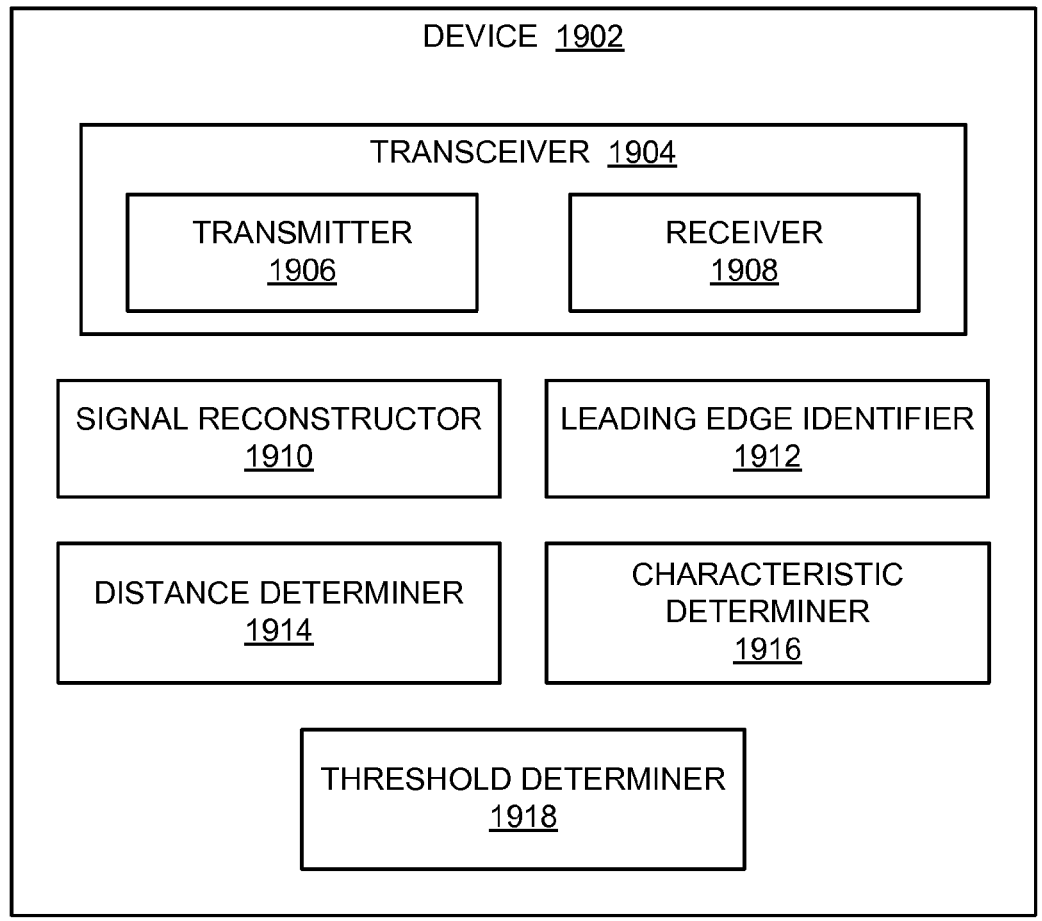
FIG. 19 is a simplified block diagram of several sample aspects of components that may be employed in communication nodes.

As described above, FIG. 1 illustrates several sample components that may be incorporated into a device (e.g., device 102, 104, 402, or 404) for providing signal-based gain control and/or leading edge detection and other functionality as discussed herein. FIG. 19 also illustrates several sample components that may be incorporated into such a device. It should be appreciated that these components or other similar components may be incorporated into other devices in a system. For example, both devices that participate in a two-way ranging operation may employ signal-based gain control leading edge detection as taught herein. Also, the functionality of any of the components of a given device as described herein may be implemented as one or more components.

As shown in FIG. 1, the device 102 includes a transceiver 108 for sending data to and receiving data from the device 104 (and/or one or more other devices, not shown). The transceiver 108 includes a transmitter 110 for transmitting signals (e.g., signals comprising pulses, packets, messages, information, and so on) and a receiver 112 for receiving signals (e.g., receiving sets of signals) at different gain levels. Similarly, as shown in FIG. 19, the device 1902 includes a transceiver 1904 for sending data to and receiving data from one or more other devices, not shown. The transceiver 1904 includes a transmitter 1906 for transmitting signals and a receiver 1908 for receiving signals (e.g., receiving sets of pulses using different gain levels, sampling received pulses, and so on).

The devices 102 and 1902 also include other components that provide functionality relating to the operations described herein. For example, a signal-based gain controller 114 may provide functionality for selecting one or more gain levels to be used for processing signals (e.g., determining characteristics of sets of signals received from another device, selecting a gain level from a set of gain levels based on determined characteristics, identifying a received signal mode based on a selected gain level). The receiver 112 and/or 1908 also may provide functionality for processing a signal (e.g., adjusting gain of a received signal) based on the selected gain level(s). In addition, a processor 116 may provide functionality for processing signals (e.g., ranging-related signals) received from another device (e.g., based on mode information provided by the controller 114) and causing corresponding signals to be transmitted to that other device. A signal reconstructor 1910 provides functionality relating to generating a reconstruction of a received signal based on samples of the signal. A leading edge identifier 1912 provides functionality relating to identifying a leading edge associated with a received signal (e.g., identifying a leading edge of a received signal based on a threshold, identifying a signal lobe associated with a first local maximum of a signal reconstruction). A distance determiner 1914 provides functionality relating to determining a distance between two apparatuses (e.g., determining a distance based on an estimated time of arrival of a leading edge). A characteristic determiner 1916 provides functionality relating to determining a signal-related characteristic (e.g., determining at least one characteristic of a received signal). A threshold determiner 1918 provides functionality relating to determining at least one threshold (e.g., determining a threshold based on at least one determined characteristic).

In some implementations the components of FIGS. 1 and 19 may be implemented in one or more processors (e.g., each of which uses and/or incorporates data memory for storing information or code used by the processor(s) to provide this functionality). For example, some of the functionality of block 108 and some or all of the functionality of blocks 114 and 116 may be implemented by a processor or processors of a given device and data memory of that device (e.g., by execution of appropriate code and/or by appropriate configuration of processor components). Similarly, some of the functionality of block 1904 and some or all of the functionality of blocks 1910-1918 may be implemented by a processor or processors of a given device and data memory of that device (e.g., by execution of appropriate code and/or by appropriate configuration of processor components).

Figure 20:
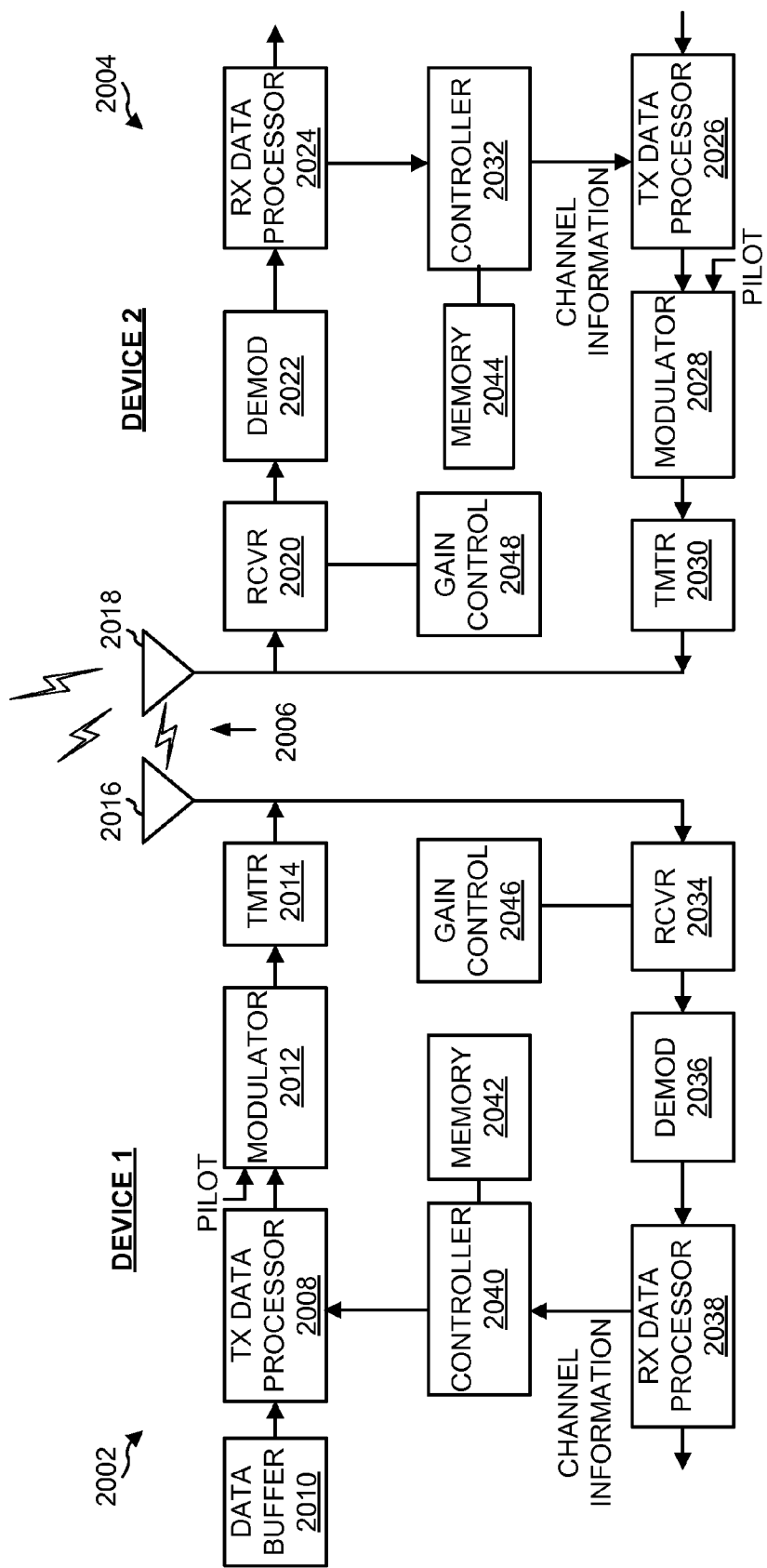
FIG. 20 is a simplified block diagram of several sample aspects of communication components.

The teachings herein may be incorporated into a device employing various components for communicating with at least one other device. FIG. 20 depicts several sample components that may be employed to facilitate communication between devices. Here, a first device 2002 and a second device 2004 are adapted to communicate via a wireless communication link 2006 over a suitable medium.

Initially, components involved in sending information from the device 2002 to the device 2004 will be treated. A transmit (TX) data processor 2008 receives traffic data (e.g., data packets) from a data buffer 2010 or some other suitable component. The transmit data processor 2008 processes (e.g., encodes, interleaves, and symbol maps) each data packet based on a selected coding and modulation scheme, and provides data symbols. In general, a data symbol is a modulation symbol for data, and a pilot symbol is a modulation symbol for a pilot (which is known a priori). A modulator 2012 receives the data symbols, pilot symbols, and possibly signaling for a link, and performs modulation (e.g., OFDM or some other suitable modulation) and/or other processing as specified by the system, and provides a stream of output chips. A transmitter (TMTR) 2014 processes (e.g., converts to analog, filters, amplifies, and frequency upconverts) the output chip stream and generates a modulated signal, which is then transmitted from an antenna 2016.

The modulated signals transmitted by the device 2002 (along with signals from other devices in communication with the device 2004) are received by an antenna 2018 of the device 2004. A receiver (RCVR) 2020 processes (e.g., conditions and digitizes) the received signal from the antenna 2018 and provides received samples. A demodulator (DEMOD) 2022 processes (e.g., demodulates and detects) the received samples and provides detected data symbols, which may be a noisy estimate of the data symbols transmitted to the device 2004 by the other device(s). A receive (RX) data processor 2024 processes (e.g., symbol demaps, deinterleaves, and decodes) the detected data symbols and provides decoded data associated with each transmitting device (e.g., device 2002).

Components involved in sending information from the device 2004 to the device 2002 will now be described. At the device 2004, traffic data is processed by a transmit (TX) data processor 2026 to generate data symbols. A modulator 2028 receives the data symbols, pilot symbols, and signaling for a link, performs modulation (e.g., OFDM or some other suitable modulation) and/or other pertinent processing, and provides an output chip stream, which is further conditioned by a transmitter (TMTR) 2030 and transmitted from the antenna 2018. In some implementations signaling for a link may include power control commands and other information (e.g., relating to a communication channel) generated by a controller 2032 for all devices (e.g. terminals) transmitting on the link to the device 2004.

At the device 2002, the modulated signal transmitted by the device 2004 is received by the antenna 2016, conditioned and digitized by a receiver (RCVR) 2034, and processed by a demodulator (DEMOD) 2036 to obtain detected data symbols. A receive (RX) data processor 2038 processes the detected data symbols and provides decoded data for the device 2002 and the link signaling. A controller 2040 may receive power control commands and other information to control data transmission and to control transmit power on the link to the device 2004.

The controllers 2040 and 2032 direct various operations of the device 2002 and the device 2004, respectively. For example, a controller may determine an appropriate filter, reporting information about the filter, and decode information using a filter. Data memories 2042 and 2044 may store program codes and data used by the controllers 2040 and 2032, respectively.

FIG. 20 also illustrates that the communication components may include one or more components that perform gain control operations as taught herein. For example, a gain control component 2046 may cooperate with the receiver 2034 and/or other components of the device 2002 to receive signals from another device (e.g., device 2004). Similarly, a gain control component 2048 may cooperate with the receiver 2020 and/or other components of the device 2004 to receive signals from another device (e.g., device 2002). It should be appreciated that for each device 2002 and 2004 the functionality of two or more of the described components may be provided by a single component. For example, a single processing component may provide the functionality of the gain control component 2046 and the controller 2040 and a single processing component may provide the functionality of the gain control component 2048 and the controller 2032.

A wireless device constructed in accordance with the teachings herein may include various components that perform functions based on signals that are transmitted by or received at the wireless device. For example, a wireless headset may include a transducer adapted to provide an audio output based on a signal processed by the receiver or as a result of the identification of a leading edge. A wireless watch may include a user interface adapted to provide an indication based on a signal processed by the receiver or as a result of the identification of a leading edge. A wireless sensing device may include a sensor adapted to provide data to be transmitted via the transmitter as a result of the receiver processing a signal or as a result of the identification of a leading edge.

A wireless device may communicate via one or more wireless communication links that are based on or otherwise support any suitable wireless communication technology. For example, in some aspects a wireless device may associate with a network. In some aspects the network may comprise a personal area network (e.g., supporting a wireless coverage area on the order of 30 meters) or a body area network (e.g., supporting a wireless coverage area on the order of 10 meters) implemented using ultra-wideband technology or some other suitable technology. In some aspects the network may comprise a local area network or a wide area network. A wireless device may support or otherwise use one or more of a variety of wireless communication technologies, protocols, or standards such as, for example, CDMA, TDMA, OFDM, OFDMA, WiMAX, and Wi-Fi. Similarly, a wireless device may support or otherwise use one or more of a variety of corresponding modulation or multiplexing schemes. A wireless device may thus include appropriate components (e.g., air interfaces) to establish and communicate via one or more wireless communication links using the above or other wireless communication technologies. For example, a device may comprise a wireless transceiver with associated transmitter and receiver components (e.g., transmitter 110 and receiver 112) that may include various components (e.g., signal generators and signal processors) that facilitate communication over a wireless medium.

In some aspects a wireless device may communicate via an impulse-based wireless communication link. For example, an impulse-based wireless communication link may utilize ultra-wideband pulses that have a relatively short length (e.g., on the order of a few nanoseconds or less) and a relatively wide bandwidth. In some aspects the ultra-wideband pulses may have a fractional bandwidth on the order of approximately 20% or more and/or have a bandwidth on the order of approximately 500 MHz or more.

The teachings herein may be incorporated into (e.g., implemented within or performed by) a variety of apparatuses (e.g., devices). For example, one or more aspects taught herein may be incorporated into a phone (e.g., a cellular phone), a personal data assistant (PDA), an entertainment device (e.g., a music or video device), a headset (e.g., headphones, an earpiece, etc.), a microphone, a medical sensing device (e.g., a sensor such as a biometric sensor, a heart rate monitor, a pedometer, an EKG device, a smart bandage, a vital signal monitor, etc.), a user I/O device (e.g., a watch, a remote control, a switch such as a light switch, a keyboard, a mouse, etc.), an environment sensing device (e.g., a tire pressure monitor), a monitor that may receive data from the medical or environment sensing device, a computer, a point-of-sale device, an entertainment device, a hearing aid, a set-top box, a gaming device, or any other suitable device. The communication devices described herein may be used in any type of sensing application, such as for sensing automotive, athletic, and physiological (medical) responses. Any of the disclosed aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitudes of applications that may incorporate any aspect of the disclosure as described herein.

These devices may have different power and data requirements. In some aspects, the teachings herein may be adapted for use in low power applications (e.g., through the use of an impulse-based signaling scheme and low duty cycle modes) and may support a variety of data rates including relatively high data rates (e.g., through the use of high-bandwidth pulses). As an example, in some implementations the width of each pulse may be on the order of 1 nanosecond or less (e.g., 100 picoseconds), while the pulse repetition interval may be on the order of 100 nanoseconds to 10 microseconds. It should be appreciated that these numbers are merely representative and that a given impulse-based system may employ different pulse widths and/or pulse repetition intervals.

Various types of modulation schemes may be used with an impulse-based signaling scheme. For example, some implementations may employ pulse position modulation (PPM). In addition, some implementations may employ pulse time hopping (e.g., based on pseudorandom sequence).

In some aspects a wireless device may comprise an access device (e.g., an access point) for a communication system. Such an access device may provide, for example, connectivity to another network (e.g., a wide area network such as the Internet or a cellular network) via a wired or wireless communication link. Accordingly, the access device may enable another device (e.g., a wireless station) to access the other network or some other functionality. In addition, it should be appreciated that one or both of the devices may be portable or, in some cases, relatively non-portable. Also, it should be appreciated that a wireless device also may be capable of transmitting and/or receiving information in a non-wireless manner (e.g., via a wired connection) via an appropriate communication interface.

Figure 21:
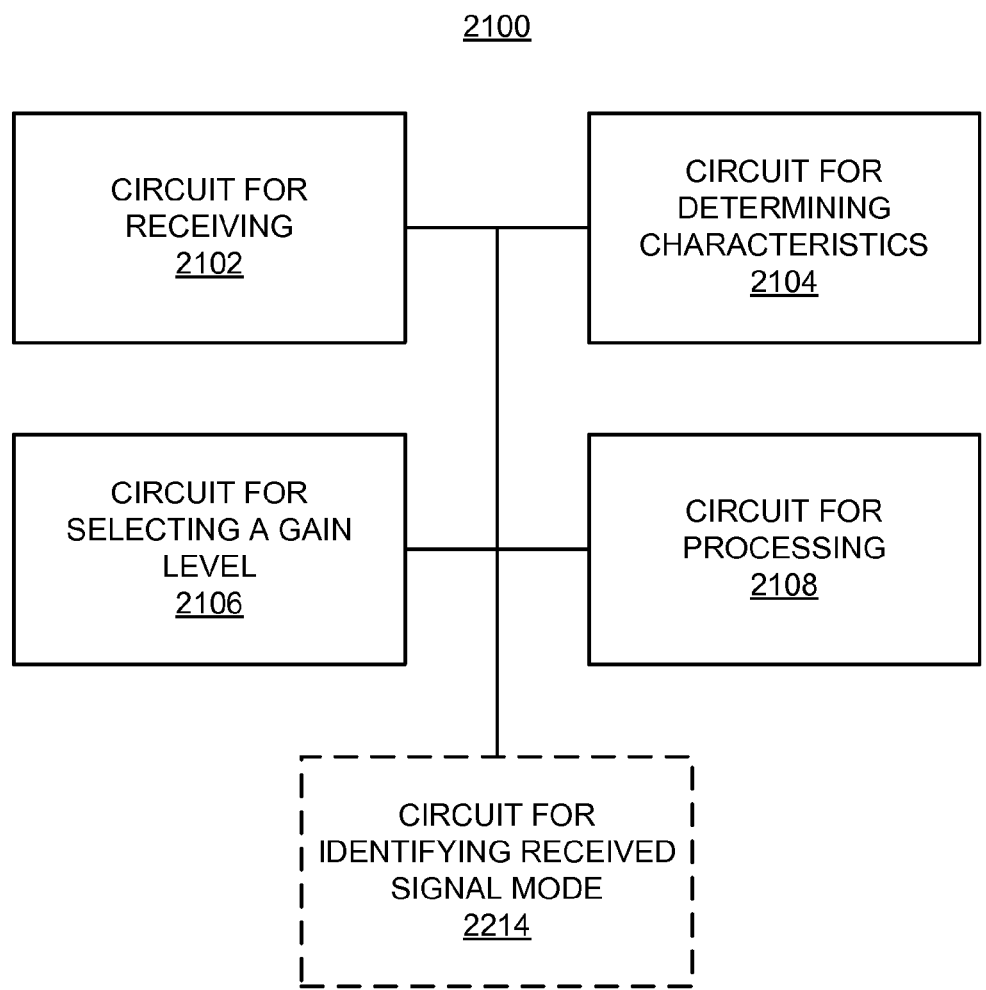
FIG. 21 is a simplified block diagram of several sample aspects of an apparatus configured to provide signal-based gain control functionality as taught herein.
Figure 22:
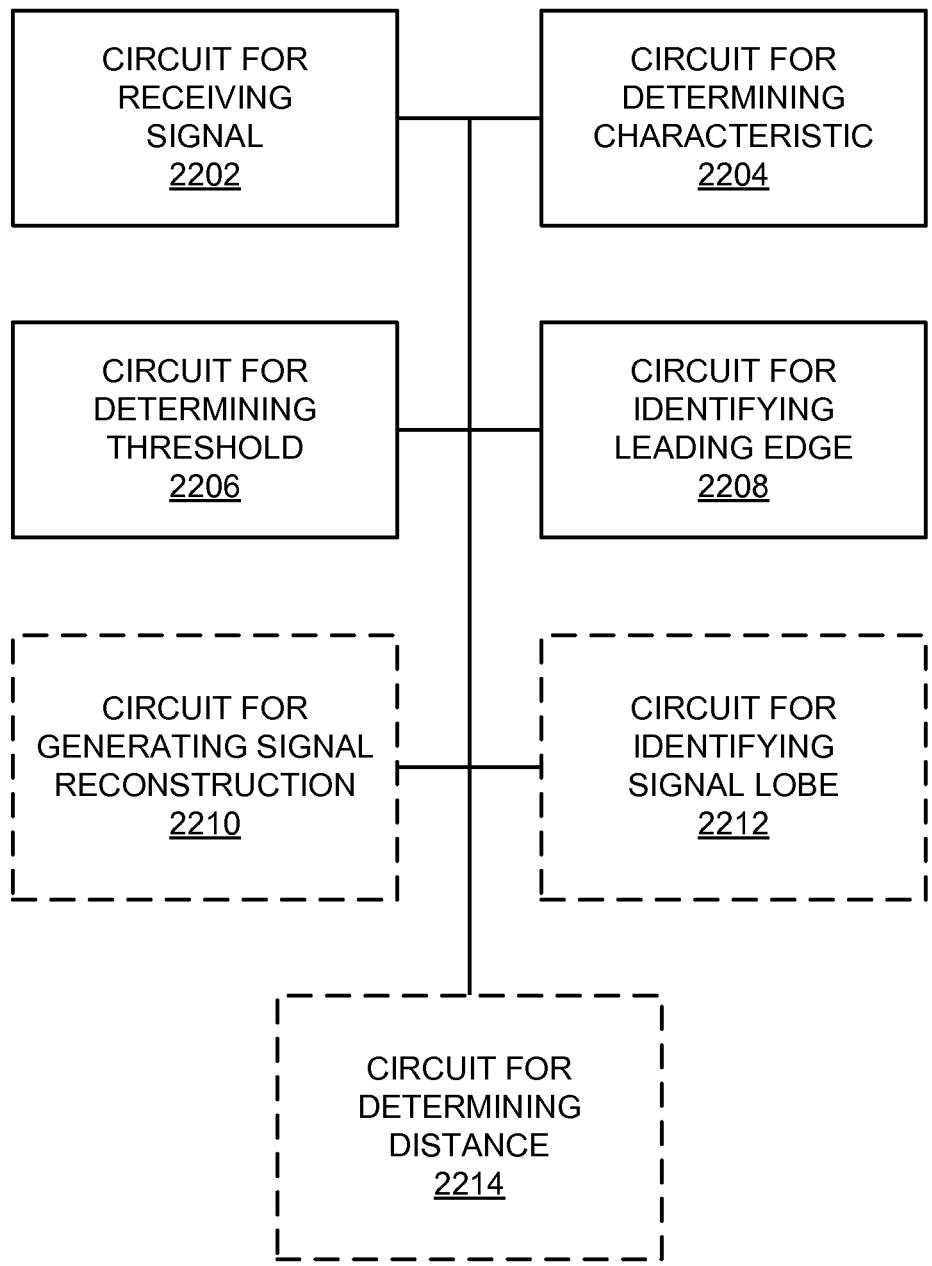
FIG. 22 is a simplified block diagram of several sample aspects of an apparatus configured to identify a leading edge as taught herein.

The components described herein may be implemented in a variety of ways. Referring to FIGS. 21 and 22, apparatuses 2100 and 2200 are represented as a series of interrelated functional blocks that may represent functions implemented by, for example, one or more circuits (e.g., an integrated circuit such as an ASIC) or may be implemented in some other manner as taught herein. As discussed herein, a circuit may include a processor, software, other components, or some combination thereof.

The apparatus 2100 may include one or more modules that may perform functionality as described herein (e.g., with regard to one or more of the accompanying figures) and that may correspond in some aspects to similarly designated "means for" functionality in the appended claims. For example, means for receiving sets of signals (e.g., a circuit for receiving 2102) may correspond to, for example, a receiver as discussed herein and may be implemented as, for example, a processor or an ASIC. Means for determining characteristics (e.g., a circuit for determining characteristics 2104) may correspond to, for example, a gain controller as discussed herein and may be implemented as, for example, a processor or an ASIC. Means for selecting a gain level (e.g., a circuit for selecting a gain level 2106) may correspond to, for example, a gain controller as discussed herein and may be implemented as, for example, a processor or an ASIC. Means for processing another signal (e.g., a circuit for processing 2108) may correspond to, for example, a receiver and/or a processor as discussed herein and may be implemented as, for example, a processor or an ASIC. Means for identifying a received signal mode (e.g., a circuit for identifying received signal mode 2110) may correspond to, for example, a gain controller as discussed herein and may be implemented as, for example, a processor or an ASIC. Means for receiving a signal (e.g., a circuit for receiving signal 2202) may correspond to, for example, a receiver as discussed herein and may be implemented as, for example, a processor or an ASIC. Means for determining at least one characteristic (e.g., a circuit for determining characteristic 2204) may correspond to, for example, a characteristic determiner as discussed herein and may be implemented as, for example, a processor or an ASIC. Means for determining a threshold (e.g., a circuit for determining threshold 2206) may correspond to, for example, a threshold determiner as discussed herein and may be implemented as, for example, a processor or an ASIC. Means for identifying a leading edge (e.g., a circuit for identifying leading edge 2208) may correspond to, for example, a leading edge identifier as discussed herein and may be implemented as, for example, a processor or an ASIC. Means for generating a reconstruction (e.g., a circuit for generating signal reconstruction 2210) may correspond to, for example, a signal reconstructor as discussed herein and may be implemented as, for example, a processor or an ASIC. Means for identifying a signal lobe (e.g., a circuit for identifying signal lobe 2212) may correspond to, for example, a leading edge identifier as discussed herein and may be implemented as, for example, a processor or an ASIC. Means for determining a distance (e.g., a circuit for determining distance 2214) may correspond to, for example, a distance determiner as discussed herein and may be implemented as, for example, a processor or an ASIC.

As noted above, in some aspects these components may be implemented via appropriate processor components. These processor components may in some aspects be implemented, at least in part, using structure as taught herein. In some aspects a processor may be adapted to implement a portion or all of the functionality of one or more of these components. In some aspects, one or more of any components represented by dashed boxes are optional.

As noted above, the apparatuses 2100 and 2200 may comprise one or more integrated circuits. For example, in some aspects a single integrated circuit may implement the functionality of one or more of the illustrated components, while in other aspects more than one integrated circuit may implement the functionality of one or more of the illustrated components.

In addition, the components and functions represented by FIGS. 21 and 22 as well as other components and functions described herein, may be implemented using any suitable means. Such means also may be implemented, at least in part, using corresponding structure as taught herein. For example, the components described above in conjunction with the "circuit for" components of FIGS. 21 and 22 also may correspond to similarly designated "means for" functionality. Thus, in some aspects one or more of such means may be implemented using one or more of processor components, integrated circuits, or other suitable structure as taught herein.

Also, it should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of: A, B, or C" used in the description or the claims means "A or B or C or any combination thereof."

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit (IC), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Thus, in some aspects computer readable medium may comprise non-transitory computer readable medium (e.g., tangible media). In addition, in some aspects computer readable medium may comprise transitory computer readable medium (e.g., a signal). Combinations of the above should also be included within the scope of computer-readable media.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. A method of leading edge detection, comprising:
   receiving a signal;
   determining at least one characteristic of the received signal;
   determining a plurality of distinct thresholds based on the at least one characteristic;
   receiving a subsequent signal;
   sampling the subsequent signal based on the plurality of distinct thresholds to generate a plurality of sampled signals, respectively;
   combining the sampled signals to generate a signal reconstruction of the subsequent signal;

identifying a leading edge of the subsequent signal based on the signal reconstruction.

2. The method of claim 1, wherein the at least one characteristic is indicative of a peak amplitude associated with the received signal.

3. The method of claim 1, wherein:
the determination of the at least one characteristic comprises identifying a signal mode associated with the received signal; and
the determination of the thresholds is based on the identified signal mode.

4. The method of claim 3, wherein the signal mode is indicative of a signal-to-noise ratio associated with the received signal.

5. The method of claim 3, wherein:
the reception of the signal comprises receiving sets of pulses using different gain levels; and
the identification of the signal mode comprises:
  determining gain level metrics that indicate how the use of the different gain levels affects the reception of the sets of pulses,
  using the gain level metrics to determine a minimum gain level that provides adequate received signal detection, and
  selecting the signal mode based on the minimum gain level.

6. The method of claim 3, wherein the identification of the leading edge comprises:
determining a timing estimate of the leading edge; and
performing bias correction based on the signal mode to adjust the timing estimate.

7. The method of claim 1,
wherein identifying the leading edge comprises identifying a signal lobe associated with a first local maximum of the signal reconstruction, and
wherein the identification of the leading edge comprises identifying timing of the signal lobe.

8. The method of claim 7, wherein:
the identification of the leading edge further comprises performing zero insertion on the signal reconstruction to generate a higher resolution signal lobe; and
the identification of the timing comprises determining timing of the higher resolution signal lobe.

9. The method of claim 1, wherein sampling the subsequent signal comprises using one-bit quantization to sample the subsequent signal.

10. The method of claim 1, wherein:
the determination of the at least one characteristic is performed by a hardware module;
the hardware module sends an indication of the at least one characteristic to a software module; and
the identification of the leading edge is performed by the software module.

11. The method of claim 1, wherein:
the identification of the leading edge comprises estimating a time of arrival of the leading edge; and
the method further comprises determining a distance between an apparatus that receives the signal and another apparatus based on the estimated time of arrival.

12. An apparatus for leading edge detection, comprising:
a receiver configured to receive a signal and a subsequent signal;
a characteristic determiner configured to determine at least one characteristic of the received signal;
a threshold determiner configured to determine a plurality of distinct thresholds based on the at least one characteristic;
a signal reconstructor configured to sample the subsequent signal based on the plurality of distinct thresholds to generate respective sampled signals, and to combine the sampled signals to generate a signal reconstruction of the subsequent signal;
a leading edge identifier configured to identify a leading edge of the subsequent signal based on the signal reconstruction.

13. The apparatus of claim 12, wherein the at least one characteristic is indicative of a peak amplitude associated with the received signal.

14. The apparatus of claim 12, wherein:
the determination of the at least one characteristic comprises identifying a signal mode associated with the received signal; and
the determination of the thresholds is based on the identified signal mode.

15. The apparatus of claim 14, wherein the signal mode is indicative of a signal-to-noise ratio associated with the received signal.

16. The apparatus of claim 14, wherein:
the reception of the signal comprises receiving sets of pulses using different gain levels; and
the identification of the signal mode comprises:
  determining gain level metrics that indicate how the use of the different gain levels affects the reception of the sets of pulses,
  using the gain level metrics to determine a minimum gain level that provides adequate received signal detection, and
  selecting the signal mode based on the minimum gain level.

17. The apparatus of claim 14, wherein the identification of the leading edge comprises:
determining a timing estimate of the leading edge; and
performing bias correction based on the signal mode to adjust the timing estimate.

18. The apparatus of claim 12, wherein:
the leading edge identifier is further configured to identify a signal lobe associated with a first local maximum of the signal reconstruction; and
the identification of the leading edge comprises identifying timing of the signal lobe.

19. The apparatus of claim 18, wherein:
the identification of the leading edge further comprises performing zero insertion on the signal reconstruction to generate a higher resolution signal lobe; and
the identification of the timing comprises determining a timing of the higher resolution signal lobe.

20. The apparatus of claim 12, wherein the signal reconstructor comprises a one-bit quantization to sample the subsequent signal.

21. The apparatus of claim 12, wherein:
the determination of the at least one characteristic is performed by a hardware module;
the hardware module sends an indication of the at least one characteristic to a software module; and
the identification of the leading edge is performed by the software module.

22. The apparatus of claim 12, wherein:
the identification of the leading edge comprises estimating a time of arrival of the leading edge; and
the apparatus further comprises a distance determiner configured to determine a distance between the apparatus and another apparatus based on the estimated time of arrival.

23. An apparatus for leading edge detection, comprising:
means for receiving a signal and a subsequent signal;
means for determining at least one characteristic of the received signal;
means for determining a plurality of distinct thresholds based on the at least one characteristic;
means for generating a signal reconstruction of the subsequent signal, wherein the signal reconstruction means is configured to sample the subsequent signal based on the plurality of distinct thresholds to generate a plurality of sampled signals, and combine the sampled signals to generate the signal reconstruction; and
means for identifying a leading edge of the subsequent signal based on the signal reconstruction.

24. The apparatus of claim 23, wherein the at least one characteristic is indicative of a peak amplitude associated with the received signal.

25. The apparatus of claim 23, wherein:
the determination of the at least one characteristic comprises identifying a signal mode associated with the received signal; and
the determination of the thresholds is based on the identified signal mode.

26. The apparatus of claim 25, wherein the signal mode is indicative of a signal-to-noise ratio associated with the received signal.

27. The apparatus of claim 25, wherein:
the reception of the signal comprises receiving sets of pulses using different gain levels; and
the identification of the signal mode comprises:
determining gain level metrics that indicate how the use of the different gain levels affects the reception of the sets of pulses,
using the gain level metrics to determine a minimum gain level that provides adequate received signal detection, and
selecting the signal mode based on the minimum gain level.

28. The apparatus of claim 25, wherein the identification of the leading edge comprises:
determining a timing estimate of the leading edge; and
performing bias correction based on the signal mode to adjust the timing estimate.

29. The apparatus of claim 23, further comprising:
means for identifying a signal lobe associated with a first local maximum of the signal reconstruction,
wherein the identification of the leading edge comprises identifying timing of the signal lobe.

30. The apparatus of claim 29, wherein:
the identification of the leading edge further comprises performing zero insertion on the signal reconstruction to generate higher resolution signal lobe; and
the identification of the timing comprises determining timing of the higher resolution signal lobe.

31. The apparatus of claim 23, wherein the signal reconstruction means comprises means for performing a one-bit quantization to sample the subsequent signal.

32. The apparatus of claim 23, wherein:
the determination of the at least one characteristic is performed by a hardware module;
the hardware module sends an indication of the at least one characteristic to a software module; and
the identification of the leading edge is performed by the software module.

33. The apparatus of claim 23, wherein:
the identification of the leading edge comprises estimating a time of arrival of the leading edge; and
the apparatus further comprises means for determining a distance between the apparatus and another apparatus based on the estimated time of arrival.

34. A computer-program product for leading edge detection, comprising:
computer-readable storage device comprising codes executable to:
receive a signal;
determine at least one characteristic of the received signal;
determine a plurality of distinct thresholds based on the at least one characteristic;
receive a subsequent signal;
sample the subsequent signal based on the plurality of distinct thresholds to generate a plurality of sampled signals, respectively;
combine the sampled signals to generate a signal reconstruction of the subsequent signal; and
identify a leading edge of the subsequent signal based on the signal reconstruction.

35. A headset, comprising:
a receiver configured to receive a signal and a subsequent signal;
a characteristic determiner configured to determine at least one characteristic of the received signal;
a threshold determiner configured to determine a plurality of distinct thresholds based on the at least one characteristic;
a signal reconstructor configured to sample the subsequent signal based on the plurality of distinct thresholds to generate respective sampled signals, and to combine the sampled signals to generate a signal reconstruction of the subsequent signal;
a leading edge identifier configured to identify a leading edge of the subsequent signal based on the signal reconstruction; and
a transducer configured to provide an audio output as a result of the identification of the leading edge.

36. A watch, comprising:
a receiver configured to receive a signal and a subsequent signal;
a characteristic determiner configured to determine at least one characteristic of the received signal;
a threshold determiner configured to determine a plurality of distinct thresholds based on the at least one characteristic;
a signal reconstructor configured to sample the subsequent signal based on the plurality of distinct thresholds to generate respective sampled signals, and to combine the sampled signals to generate a signal reconstruction of the subsequent signal;
a leading edge identifier configured to identify a leading edge of the subsequent signal based on the signal reconstruction; and
a user interface configured to provide an indication as a result of the identification of the leading edge.

37. A sensing device, comprising:
a receiver configured to receive a signal and a subsequent signal;
a characteristic determiner configured to determine at least one characteristic of the received signal;
a threshold determiner configured to determine a plurality of distinct thresholds based on the at least one characteristic;
a signal reconstructor configured to sample the subsequent signal based on the plurality of distinct thresholds to generate respective sampled signals, and to combine the sampled signals to generate a signal reconstruction of the subsequent signal;
a leading edge identifier configured to identify a leading edge of the subsequent signal based on the signal reconstruction; and
a sensor configured to provide data for transmission as a result of the identification of the leading edge.

* * * * *